US010095255B2

(12) United States Patent
Takahashi

(10) Patent No.: US 10,095,255 B2
(45) Date of Patent: Oct. 9, 2018

(54) INFORMATION PROCESSING METHOD, INFORMATION PROCESSING APPARATUS, AND RECORDING MEDIUM HAVING PROGRAM RECORDED THEREON, WITH WHICH ELECTRICAL DEVICE CONNECTION RELATIONSHIP IS DETERMINED

(71) Applicant: Panasonic Intellectual Property Corporation of America, Torrance, CA (US)

(72) Inventor: Tomonari Takahashi, Osaka (JP)

(73) Assignee: PANASONIC INTELLECTUAL PROPERTY CORPORATION OF AMERICA, Torrance, CA (US)

(*) Notice: Subject to any disclaimer, the term of this patent is extended or adjusted under 35 U.S.C. 154(b) by 314 days.

(21) Appl. No.: 14/864,967

(22) Filed: Sep. 25, 2015

(65) Prior Publication Data
US 2016/0116931 A1  Apr. 28, 2016

(30) Foreign Application Priority Data
Oct. 24, 2014  (JP) .................................. 2014-217561

(51) Int. Cl.
*G01R 19/25* (2006.01)
*G05F 1/66* (2006.01)
*G05B 15/02* (2006.01)

(52) U.S. Cl.
CPC ........... *G05F 1/66* (2013.01); *G01R 19/2513* (2013.01); *G05B 15/02* (2013.01)

(58) Field of Classification Search
CPC ......... G05F 1/66; G05B 15/02; G06F 1/3203; G06F 1/324; G06F 1/26; G06F 1/3234;
(Continued)

(56) References Cited

U.S. PATENT DOCUMENTS 4,858,141 A * 8/1989 Hart ................... G01R 21/1331
340/657
2008/0317021 A1* 12/2008 Ives ....................... H04L 12/10
370/389
(Continued)

FOREIGN PATENT DOCUMENTS

JP  2013-218715  10/2013
JP  2013-243555  12/2013

OTHER PUBLICATIONS

Norford et al. (Leslie K. Norford, Steven B. Leeb, Non-intrusive electrical load monitoring in commercial buildings based on steady-state and transient load-detection algorithms, revised Sep. 17, 1995, Energy and Buildings 24 (1996) 51-64, Massachusetts Institute of Technology, Cambridge, MA 02139, USA).*

*Primary Examiner* — Kenneth M Lo
*Assistant Examiner* — Michael W Choi
(74) *Attorney, Agent, or Firm* — Greenblum & Bernstein, P.L.C.

(57) ABSTRACT

An information processing method including: acquiring power information that indicates a power amount supplied by each of a plurality of circuits; outputting a command that causes a change in power consumption for one of the electrical devices; and determining the connection relationship between the one electrical device and the circuit to which the one electrical device is connected, based on the power information acquired, in which, in the determining, when it is determined that the state of the power amounts supplied by the plurality of circuits is a steady state from the power information acquired in the acquiring, the connection relationship is determined by specifying that the circuit corresponding to the power information that includes the change in power consumption corresponding to the command output with respect to the one electrical device in the
(Continued)

outputting of the command is the circuit to which the one electrical device is connected.

12 Claims, 21 Drawing Sheets

(58) Field of Classification Search
CPC ........ G06F 1/3212; G06F 1/32; G06F 1/3206; G06F 1/3296; Y02B 60/1271; Y02B 60/50; H02J 7/025; H02J 3/00; H02J 3/14; H02J 2003/143; H02J 2003/003; H02J 11/00; G01R 19/2513
USPC .................................................. 700/295, 286
See application file for complete search history.

(56) References Cited

U.S. PATENT DOCUMENTS

| | | | | |
|---|---|---|---|---|
| 2011/0144819 | A1* | 6/2011 | Andrews | G01D 4/004 700/291 |
| 2012/0072141 | A1 | 3/2012 | Hidai et al. | |
| 2012/0136593 | A1* | 5/2012 | Donaldson | G01D 4/002 702/60 |
| 2012/0290230 | A1* | 11/2012 | Berges Gonzalez | G01D 4/004 702/61 |
| 2013/0031384 | A1* | 1/2013 | Yamamoto | G06F 1/28 713/300 |
| 2014/0336831 | A1* | 11/2014 | Seo | G05B 15/02 700/286 |

\* cited by examiner

| COMMAND | TIME |
|---|---|
| ON | — |
| OFF | 30 |
| ON | 90 |
| OFF | 60 | ced
INFORMATION PROCESSING METHOD, INFORMATION PROCESSING APPARATUS, AND RECORDING MEDIUM HAVING PROGRAM RECORDED THEREON, WITH WHICH ELECTRICAL DEVICE CONNECTION RELATIONSHIP IS DETERMINED

BACKGROUND

1. Technical Field

The present disclosure relates to an information processing method, an information processing apparatus, and a recording medium having a program recorded thereon.

2. Description of the Related Art

Japanese Unexamined Patent Application Publication No. 2013-218715 discloses technology that identifies the type of an electrical device on the basis of the result of measuring a current, voltage, or power supplied from a power source to the electrical device.

SUMMARY

However, in Japanese Unexamined Patent Application Publication No. 2013-218715, there is a problem in that it is often the case that it is not possible to identify a circuit that supplies power and an electrical device that is connected to that circuit.

One non-limiting and exemplary embodiment provides an information processing method, an information processing apparatus, and a recording medium having a program recorded thereon, with which it is possible to more reliably determine the connection relationship between a circuit that supplies power and an electrical device that is connected to that circuit.

In one general aspect, the techniques disclosed here feature an information processing method that includes: acquiring power information indicating a power amount supplied by each of a plurality of circuits to which one or more electrical devices are respectively connected; outputting a command that causes a change in power consumption with respect to one of the electrical devices; and determining the connection relationship between the one electrical device and the circuit to which the one electrical device is connected, based on a plurality of items of the power information acquired in the acquiring, in which, in the determining, it is determined whether or not the state of the power amounts supplied by the plurality of circuits is a steady state from the plurality of items of power information acquired in the acquiring, and, when it is determined that the state of the power amounts supplied by the plurality of circuits is a steady state, the connection relationship is determined by causing the command for the one electrical device to be output in the outputting of the command and specifying that the circuit corresponding to the power information that includes the change in power consumption corresponding to the command that was output in the outputting of the command, from among the plurality of items of power information acquired in the acquiring, is the circuit to which the one electrical device is connected.

According to the present disclosure, it is possible to realize an information processing method and the like with which it is possible to more reliably determine the connection relationship between a circuit that supplies power and an electrical device that is connected to that circuit.

It should be noted that these general or specific aspects may be realized by a method, an integrated circuit, a computer program, or a recording medium such as a computer-readable CD-ROM, and may be realized by an arbitrary combination of a method, an integrated circuit, a computer program, and a recording medium.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
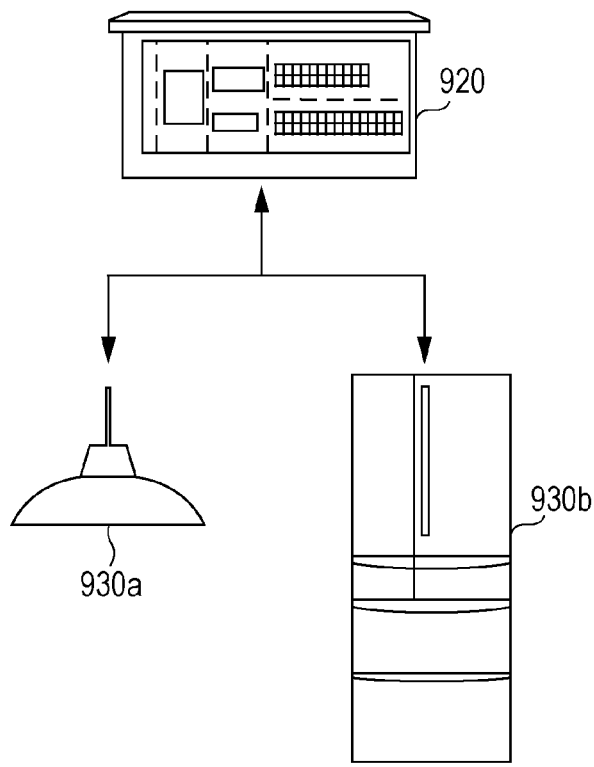
FIG. 1A is a drawing depicting an example of the connection relationship between electrical devices and a power supply circuit.

Findings Forming the Basis of the Present Disclosure

The present inventor found that the following problems occur with regard to the information processing apparatus described in the "Description of the Related Art" section.

Japanese Unexamined Patent Application Publication No. 2013-218715 states that a power source tap to which an electrical device is connected is specified on the basis of the timing at which the electrical device receives an operation signal and a timing the which a power change occurs.

More specifically, the information processing apparatus disclosed in Japanese Unexamined Patent Application Publication No. 2013-218715 is configured of: a first acquisition unit that acquires a tap identifier that is allocated to a power source tap, and a measurement result for a power amount supplied via the power source tap; a second acquisition unit that, when remote operation of an electrical device is carried out, acquires an operation signal used for the remote operation; a specifying unit that specifies the type of electrical device corresponding to feature information of the operation signal acquired by the second acquisition unit, by carrying out matching with a database in which the feature information of operation signals used for remote operations is stored for each electrical device; and an association processing unit that carries out processing to associate the electrical device of the type specified by the specifying unit and the tap identifier acquired by the first acquisition unit, on the basis of the timing at which the second acquisition unit acquired the operation signal and the measurement result acquired by the first acquisition unit.

According to this configuration, a remotely operated electrical device and a power source tap to which that electrical device is connected are associated on the basis of a power change that occurred when the remote operation was carried out.

However, in the technology disclosed in Japanese Unexamined Patent Application Publication No. 2013-218715, there are cases where, due to the placement state of the electrical device and the circuit that supplies power, it is not possible to detect power changes of the electrical device even though the operation signal is received. In short, in the technology disclosed in Japanese Unexamined Patent Application Publication No. 2013-218715, there are cases where the electrical device and the power source tap to which the electrical device is connected are not able to be associated. For example, the operating state of an electrical device for which the power source is already ON does not change when an operation signal that turns the power source ON is received, and therefore the power consumption of the electrical device is not able to be measured.

Furthermore, in the technology disclosed in Japanese Unexamined Patent Application Publication No. 2013-218715, when a plurality of electrical devices are connected to a power supply circuit that measures power amounts, there are cases where it is not possible to detect power changes of the electrical devices. Hereinafter, FIGS. 1A, 1B, 2A, and 2B will be used to describe an example of such a case.

Figure 1B:
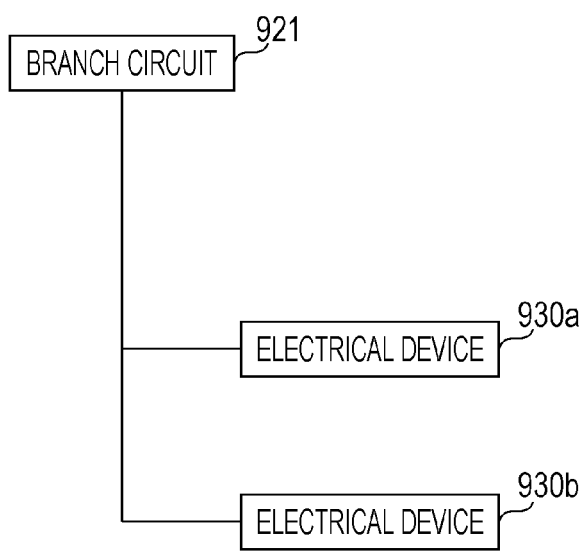
FIG. 1B is a drawing depicting an example of the connection relationship between electrical devices and a branch circuit.

FIG. 1A is a drawing depicting an example of the connection relationship between electrical devices and a power supply circuit, and FIG. 1B is a drawing depicting an example of the connection relationship between electrical devices and a branch circuit. A branch circuit 921 depicted in FIG. 1B is an example of a branch circuit that is included in a power supply circuit 920 depicted in FIG. 1A. As depicted in FIG. 1A, an electrical device 930a and an electrical device 930b are connected to the power supply circuit 920, and for simplification it is assumed that other electrical devices 930 excluding the electrical device 930a and the electrical device 930b are not connected to the power supply circuit 920. Furthermore, as depicted in FIG. 1A, the electrical device 930a is a lighting device and the electrical device 930b is a refrigerator, for example. Furthermore, as depicted in FIG. 1A, the power supply circuit 920 is a distribution board, for example.

Figure 2A:
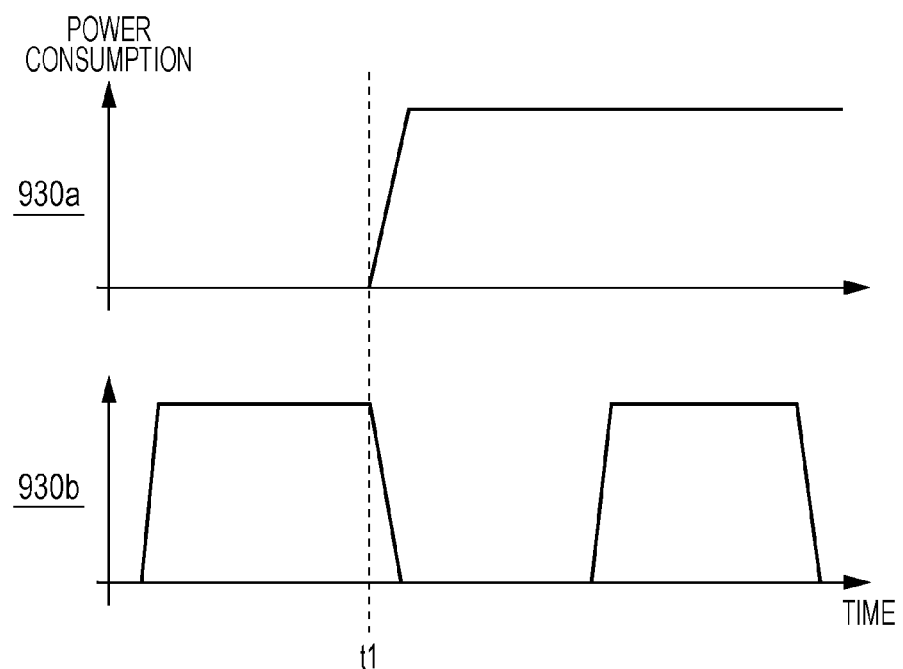
FIG. 2A is a drawing depicting, in a time-sequential manner, examples of power changes of the two electrical devices connected to the branch circuit.
Figure 2B:
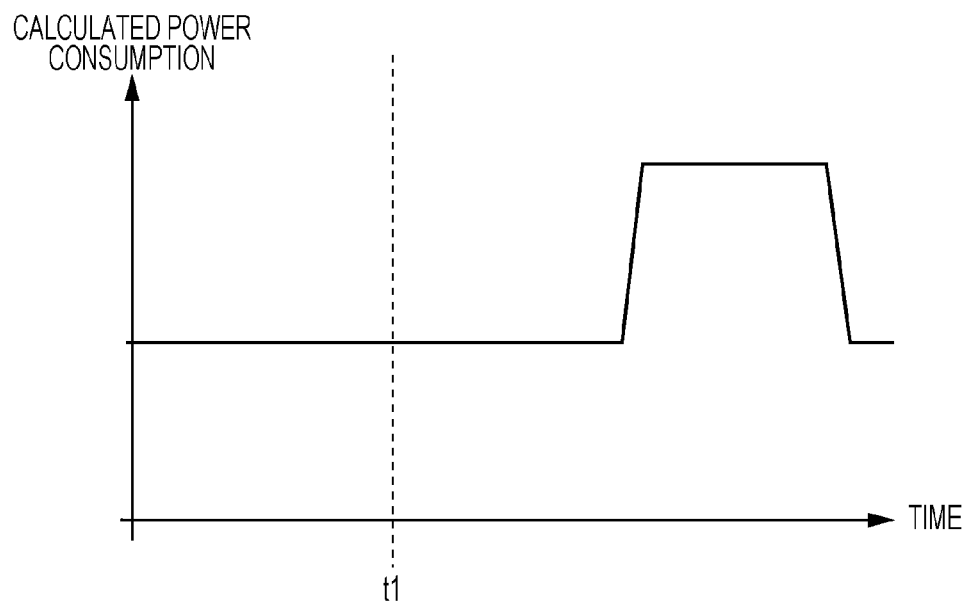
FIG. 2B is a drawing depicting, in a time-sequential manner, an example of power consumption measured by the power supply circuit.
Figure 3:
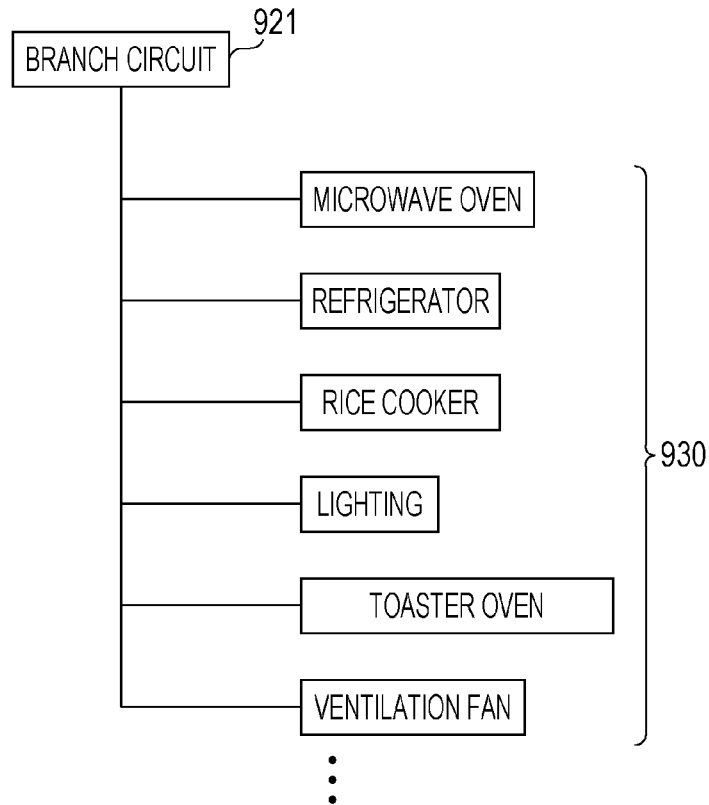
FIG. 3 is a drawing depicting another example of electrical devices connected to a branch circuit.

FIG. 2A is a drawing depicting, in a time-sequential manner, examples of power changes of the two electrical devices connected to the branch circuit 921, and FIG. 2B is a drawing depicting, in a time-sequential manner, an example of power consumption measured by the power supply circuit 920. FIG. 3 is a drawing depicting another example of electrical devices connected to the branch circuit 921. FIG. 2B corresponds to an example in which the power consumed by the branch circuit 921 to which the electrical device 930a and the electrical device 930b depicted in FIG. 2A are connected has been measured.

As depicted in FIG. 2A, it is assumed that the electrical device 930a is operated at time t1 and the power source is changed from OFF to ON, for example. Furthermore, the electrical device 930b is a refrigerator, for example, and therefore periodically carries out an intermittent operation. In this case, the total of the power consumption of all of the electrical devices 930 (here, the electrical device 930a and the electrical device 930b) connected to the power supply circuit 920 is the power consumption measured by the power supply circuit 920.

However, as depicted in FIG. 2B, at the time point of time t1, the change in power consumption (power consumption increase change) of the electrical device 930b caused by the power source having changed from OFF to ON and the change in power consumption (power consumption decrease change) of the electrical device 930b caused by the operation thereof having stopped according to the timing of the intermittent operation offset each other. In short, at the time point of time t1, the power supply circuit 920 measures that there is no major power change in the power consumption of the branch circuit 921.

In this way, when there are a plurality of the electrical devices 930 connected to the branch circuit 921 at which power amounts are measured, there are cases where the power consumption of an electrical device that has been operated is not able to be detected as a change in the power consumption of the branch circuit 921 despite having changed.

It should be noted that it is often the case that wall sockets in some rooms are connected to a branch circuit of a distribution board, for example. In short, it is not uncommon for a plurality of electrical devices to be connected to the branch circuit 921 included in the power supply circuit 920, and for five or more electrical devices 930 to be connected as depicted in FIG. 3, for example.

When there is a high number of the electrical devices 930 connected to the branch circuit 921, it is often the case that, even though there is a change in the power consumption of one of the electrical device 930, there is also a change in the power consumption of the another electrical device 930, and it is difficult to grasp the power change of the one electrical device even when the power amount flowing to the branch circuit 921 is measured. In short, in the technology disclosed in Japanese Unexamined Patent Application Publication No. 2013-218715, there is a problem in that in the case where there is a high number of the electrical devices 930 connected to the branch circuit 921, it is not possible to distinguish between a power change of an electrical device 930 that has received an operation signal and a power change of another electrical device 930 connected to the branch circuit 921, and therefore, as a result, it is not possible to specify the type of an electrical device.

Figure 4:
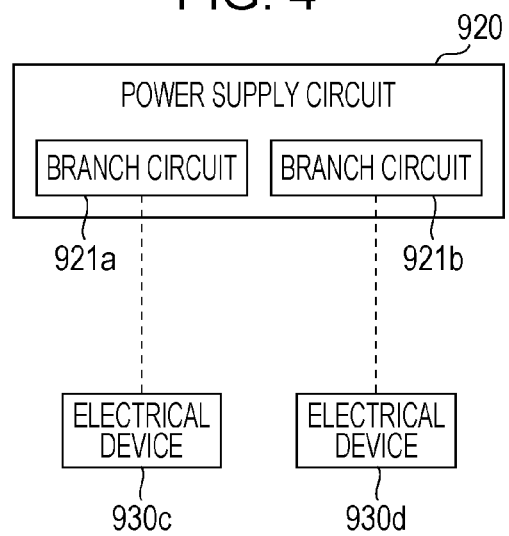
FIG. 4 is a drawing depicting an example of branch circuits that make up a power supply circuit, and electrical devices connected to the branch circuits.
Figure 5:
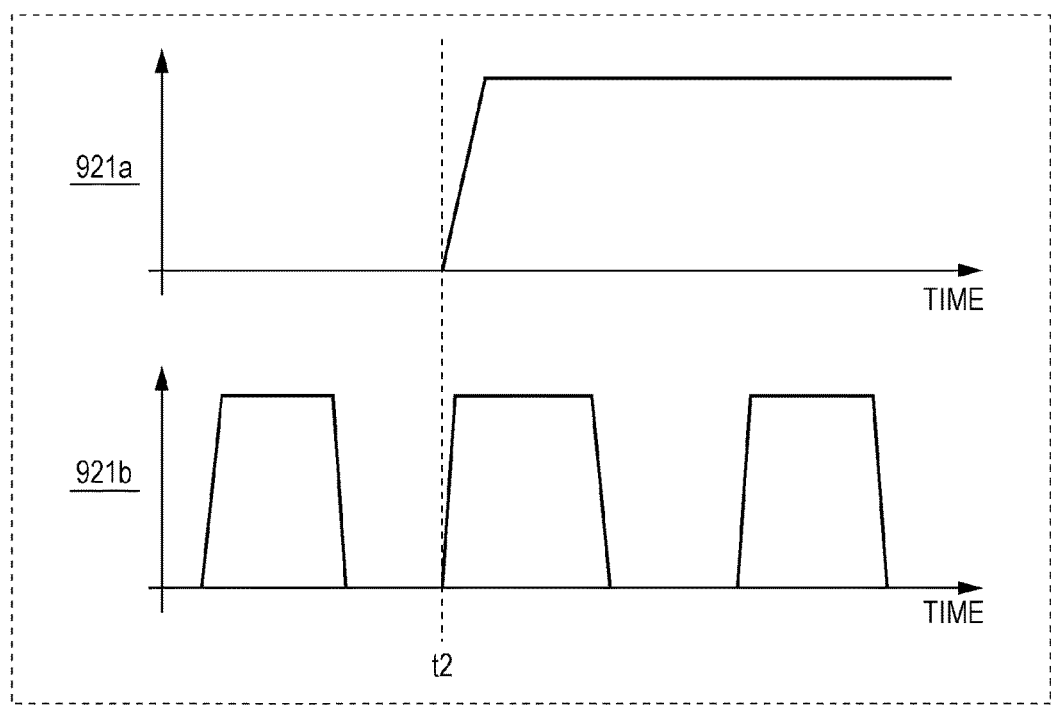
FIG. 5 is a drawing depicting, in a time-sequential manner, an example of the power consumption of the branch circuits measured by the power supply circuit.

Furthermore, in the case where there are a plurality of branch circuits 921 included in the power supply circuit 920, the same problem as that described above also occurs when an electrical device 930 connected to a certain branch circuit receives an operation signal and causes the power consumption to change and yet an electrical device 930 connected to another branch circuit coincidentally causes a power change. FIGS. 4 and 5 will be used to describe an example of this situation.

FIG. 4 is a drawing depicting an example of branch circuits 921 that make up a power supply circuit 920, and electrical devices 930 that are connected to the branch circuits 921. FIG. 5 is a drawing depicting, in a time-sequential manner, an example of the power consumption of the branch circuits 921 measured by the power supply circuit 920. FIG. 4 depicts an example in which the power supply circuit 920, which is a distribution board, is configured of two branch circuits 921a and 921b. Furthermore, FIG. 4 depicts an example in which an electrical device 930c such as a television is connected to the branch circuit 921a and an electrical device 930d such as a refrigerator is connected to the branch circuit 921b as the electrical devices 930.

Here, it is assumed that the electrical device 930d connected to the branch circuit 921b is a refrigerator, a compressor for cooling the inside of the refrigerator is intermittently activated and stopped, and the electrical device 930c, which is a television, has received an operation signal that turns the power source to ON, at the time point of time t2, for example. In this case, the power consumption measured by the branch circuit 921a changes as depicted in FIG. 5; however, the power consumption of the branch circuit 921b is also changing. This is because the power consumption measured by the branch circuit 921b at time t2 is changing due to the compressor of the electrical device 930d having being activated at time t2. As a result, in power information that indicates the power consumption of the branch circuit 921a and the branch circuit 921b measured by the power supply circuit 920, the change in power consumption of the electrical device 930c that received an operation signal is hidden and cannot be detected. Therefore, a problem arises in that it is not possible to determine the connection relationship between the branch circuit 921a and the electrical device 930c connected to the branch circuit 921a.

Furthermore, many types of electrical devices are connected to actual branch circuits as depicted in FIG. 3, and each of the electrical devices changes power consumption as appropriate. At such times, as in the technology disclosed in Japanese Unexamined Patent Application Publication No. 2013-218715, it is not always possible to detect a change in the power consumption of a target electrical device merely by simply measuring a change in the power consumption of a branch circuit when the electrical device is operated. Thus, a method that makes it easier to measure changes in the power consumption of a target electrical device has been required.

It should be noted that, in the technology disclosed in Japanese Unexamined Patent Application Publication No. 2013-218715, the connection relationship between a branch circuit and an electrical device is determined at the timing at which the user performs a remote control operation. There is therefore also a problem in that, when the determining of the connection relationship between the branch circuit and the electrical device has momentarily failed due to the aforementioned problem, the connection relationship between the branch circuit and the electrical device remains unclear unless the user deliberately performs a remote control operation thereafter.

In consideration of the above, the present inventor arrived at the aspects disclosed hereinafter. In other words, an information processing method according to an aspect of the present disclosure includes: acquiring power information indicating a power amount supplied by each of a plurality of circuits to which one or more electrical devices are respectively connected; outputting a command that causes a change in power consumption with respect to one of the electrical devices; and determining the connection relationship between the one electrical device and the circuit to which the one electrical device is connected, based on a plurality of items of the power information acquired in the acquiring, in which, in the determining, it is determined whether or not the state of the power amounts supplied by the plurality of circuits is a steady state from the plurality of items of power information acquired in the acquiring, and, when it is determined that the state of the power amounts supplied by the plurality of circuits is a steady state, the connection relationship is determined by causing the command for the one electrical device to be output in the outputting of the command and specifying that the circuit corresponding to the power information that includes the change in power consumption corresponding to the command that was output in the outputting of the command, from among the plurality of items of power information acquired in the acquiring, is the circuit to which the one electrical device is connected.

According to this aspect, it is possible to realize an information processing method with which it is possible to more reliably determine the connection relationship between a circuit that supplies power and an electrical device that is connected to that circuit.

More specifically, a steady state in which changes in the power consumption of the electrical device can be measured is first determined, and a change in the power of the electrical device is made to occur thereafter. It is thereby possible to specify that the circuit corresponding to power information including the change in power consumption caused is a circuit that is connected to the electrical device, on the basis of the power information of a plurality of circuits that include the circuit to which the electrical device is connected. In this way, it is possible to determine the connection relationship between a circuit that supplies power and an electrical device that is connected to that circuit.

Furthermore, for example, the determining may include: determining whether or not the state of the power amounts supplied by the plurality of circuits is the steady state, from the plurality of items of power information acquired in the acquiring; when it is determined in the determining of the steady state that the state of the power amounts supplied by the plurality of circuits is the steady state, causing the command for the one electrical device to be output in the outputting of the command and detecting the power information that includes a change in power corresponding to the command that was output in the outputting of the command, from among the plurality of items of power information acquired in the acquiring; specifying that the circuit corresponding to the power information detected in the detecting is the circuit to which the one electrical device is connected; storing an association between the circuit specified in the specifying and the one electrical device; and determining the connection relationship, based on the association stored in the storing.

Here, for example, in the determining, when a fluctuation in the power amounts supplied by each of the plurality of circuits in a prescribed period is equal to or less than a predetermined value, it may be determined that the state of the power amounts supplied by the plurality of circuits is the steady state, and it may be specified that the circuit corresponding to the power information that includes a time difference change amount for the power amounts that is equal to or greater than a predetermined value, within a prescribed time period from a time at which the command was issued in the outputting of the command, as the power information that includes the change in power consumption corresponding to the command, is the circuit to which the one electrical device is connected.

Furthermore, for example, in the outputting of the command, a command that causes a power source state of the one electrical device to change from OFF to ON may be output as the command that causes the change in power consumption with respect to the one electrical device, and, in the outputting of the command, a command that causes the power source state of the one electrical device to change from ON to OFF may be output as the command that causes the change in power consumption with respect to the one electrical device.

Furthermore, for example, in the determining, when a fluctuation in the power amounts supplied in a prescribed period by at least one circuit from among the plurality of circuits exhibits a prescribed pattern, it may be determined that the state of the power amounts supplied by the at least one circuit is the steady state, and when it is determined that the power amounts supplied in the prescribed period by a plurality of circuits excluding the at least one circuit from among the plurality of circuits are in the steady state, it may be determined that the state of the power amounts supplied by the plurality of circuits is the steady state.

Furthermore, for example, in the determining, when the power information that includes a time difference change amount for the power amounts that is equal to or greater than a predetermined value is detected from among the power information of the plurality of circuits excluding the at least one circuit from among the plurality of circuits, within a prescribed time period from a time at which the command was issued in the outputting of the command, as the power information that includes the change in power consumption corresponding to the command, it may be specified that the circuit corresponding to the detected power information is the circuit to which the one electrical device is connected, and when the power information that includes the time difference change amount for the power amounts that is equal to or greater than the predetermined value is detected based on the prescribed pattern, from among the power information of the at least one circuit from within the prescribed time period, as the power information that includes the change in power consumption corresponding to the command, it may be specified that the circuit corresponding to the detected power information is the circuit to which the one electrical device is connected.

Furthermore, for example, in the determining, when a fluctuation in a prescribed period in the power amount supplied by each of the plurality of circuits does not match a specific pattern, it may be determined that the state of the power amounts supplied by the plurality of circuits is the steady state, a command that causes the power consumption of the one electrical device to change according to the specific pattern may be output in the outputting of the command, and it may be specified that the circuit corresponding to the power information that matches the specific pattern within a prescribed time period from a time at which the command was issued in the outputting of the command, as the power information that includes the change in power consumption corresponding to the command, is the circuit to which the one electrical device is connected.

Here, for example, the specific pattern may be a pattern in which the same change in the power amounts is repeated a plurality of times in a fixed period.

Furthermore, for example, in the determining, when a time difference change amount for a value obtained by totaling, in each period, the power amount supplied in the prescribed period in each of the plurality of circuits is equal to or less than a predetermined value, it may be determined that the fluctuation in the prescribed interval in the power amounts supplied by the plurality of circuits does not match the specific pattern.

Furthermore, for example, in the outputting of the command, a command set that causes the change in power consumption with respect to the one electrical device and is made up of a plurality of sets of a type and a time interval may be output as the command that causes the change in power consumption with respect to the one electrical device.

Furthermore, for example, in the determining, by referring to a database in which information that identifies the electrical devices, operations with respect to the electrical devices, and power consumption change patterns that accompany the operations is associated, it may be detected that the change in power consumption corresponding to the command that was output in the outputting of the command is included within the plurality of items of power information acquired in the acquiring.

Furthermore, there are included: acquiring power information indicating a power amount supplied by each of a plurality of circuits to which one or more electrical devices are respectively connected; outputting a notification for causing the user to execute a command that causes a change in power consumption with respect to one electrical device; and determining a connection relationship between the one electrical device and the circuit to which the one electrical device is connected, based on a plurality of items of the power information acquired in the acquiring, in which, in the determining, it is determined whether or not a state of the power amounts supplied by the plurality of circuits is a steady state from the plurality of items of power information acquired in the acquiring, and, when it is determined that the state of the power amounts supplied by the plurality of circuits is the steady state, the connection relationship is determined by outputting the notification for causing the user to execute the command for the one electrical device in the outputting of the notification and specifying that the circuit corresponding to the power information that includes the change in power consumption that corresponds to the command corresponding to the notification that was output in the outputting of the notification, from among the plurality of items of power information acquired in the acquiring, is the circuit to which the one electrical device is connected.

Furthermore, an information processing apparatus according to an aspect of the present disclosure is provided with: an acquisition unit that acquires power information indicating a power amount supplied by each of a plurality of circuits to which one or more electrical devices are respectively connected; a command output unit that outputs a command that causes a change in power consumption with respect to one of the electrical devices; and a determination unit that determines the connection relationship between the one electrical device and the circuit to which the one electrical device is connected, based on a plurality of items of the power information acquired in the acquiring, in which, it is determined whether or not the state of the power amounts supplied by the plurality of circuits is a steady state from the plurality of items of power information acquired by the acquisition unit, and, when it is determined that the state of the power amounts supplied by the plurality of circuits is a steady state, the determination unit determines the connection relationship by causing the command output unit to output the command for the one electrical device and specifying that the circuit corresponding to the power information that includes the change in power consumption corresponding to the command that was output by the command output unit, from among the plurality of items of power information acquired by the acquisition unit, is the circuit to which the one electrical device is connected.

Furthermore, an information processing apparatus according to an aspect of the present disclosure is provided with: a processor; and a non-transitory recording medium having recorded thereon a program that, when executed by the processor, causes the processor to perform operations including: acquiring power information indicating a power amount supplied by each of a plurality of circuits to which one or more electrical devices are respectively connected; outputting a command that causes a change in power consumption with respect to one of the electrical devices; and determining a connection relationship between the one electrical device and the circuit to which the one electrical device is connected, based on a plurality of items of the power information acquired in the acquiring, in which, in the determining, it is determined whether or not a state of the power amounts supplied by the plurality of circuits is a steady state from the plurality of items of power information acquired, and, when it is determined that the state of the power amounts supplied by the plurality of circuits is the steady state, the connection relationship is determined by outputting the command for the one electrical device and specifying that the circuit corresponding to the power information that includes the change in power consumption corresponding to the command, from among the plurality of items of power information acquired, is the circuit to which the one electrical device is connected.

It should be noted that these general or specific aspects may be realized by a method, an integrated circuit, a computer program, or a recording medium such as a computer-readable CD-ROM, and may be realized by an arbitrary combination of a method, an integrated circuit, a computer program, and a recording medium.

Hereinafter, an information processing method and the like according to an aspect of the present disclosure will be described with reference to the drawings.

It should be noted that the embodiments described hereinafter all represent specific examples of the present disclosure. The numerical values, the shapes, the materials, the constituent elements, the arrangement positions and modes of connection of the constituent elements, the steps, and the order of the steps and the like given in the following embodiments are examples and are not intended to limit the present disclosure. Furthermore, constituent elements that are not described in the independent claims indicating the most significant concepts from among the constituent elements in the following embodiments are described as optional constituent elements.

Embodiment 1

[Overall Configuration of Network System]

Figure 6:
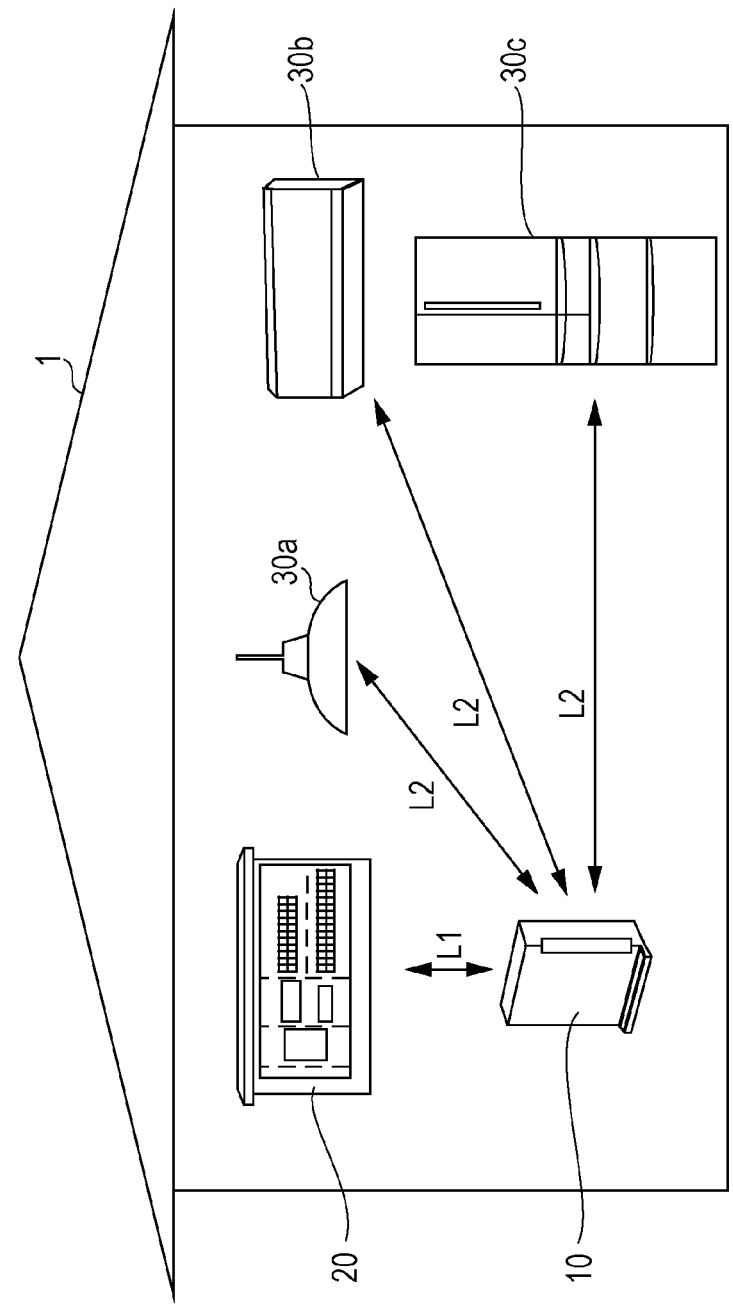
FIG. 6 is a drawing depicting an example of the overall configuration of a network system in Embodiment 1.

FIG. 6 is a drawing depicting an example of the overall configuration of a network system in Embodiment 1.

A network system 2 depicted in FIG. 6 is installed in a living space 1, for example, and is provided with an information processing apparatus 10, a smart distribution board 20, and electrical devices 30 including an electrical device 30*a*, an electrical device 30*b*, and an electrical device 30*c*. Here, the living space 1 is a space within a house in the case of a detached residence, and is a space within one dwelling unit (within a residence) in the case of a residential complex such as an apartment building or a housing estate, for example.

The smart distribution board 20 makes it possible to divide power supplied from an external power supplier to branch circuits and supply power to each electrical device 30 in the living space 1. The smart distribution board 20 is able to measure the supplied power (power consumption) of each branch circuit and transmit power information indicating the amount of supplied power (power amount consumed) of each branch circuit to the information processing apparatus 10 via a communication path L1.

The information processing apparatus 10 is constituted by a home server in the living space 1, for example, and is able to reciprocally communicate with the smart distribution board 20 and the electrical devices 30 in the living space 1. In the example depicted in FIG. 6, the information processing apparatus 10 is able to receive signals (the power information of each branch circuit) from the smart distribution board 20 via the communication path L1. Furthermore, the information processing apparatus 10 transmits commands (control signals) to the electrical devices 30 via communication paths L2 and is thereby able to control the operation of the electrical devices 30.

The electrical devices 30 are electrical devices that are installed within the living space 1, and are constituted by the electrical device 30a, the electrical device 30b, and the electrical device 30c, for example. The electrical devices 30 are able to receive the commands (control signals) from the information processing apparatus 10 via the communication paths L2, and carry out an operation according to a command when a command is received from the information processing apparatus 10. In the example depicted in FIG. 6, the electrical device 30a is a lighting fixture, the electrical device 30b is an air conditioner, and the electrical device 30c is a refrigerator. However, these are merely examples of the electrical devices 30, and white goods such as washing machines and microwave ovens, black goods such as televisions, video recorders and audio equipment, and personal computers are permissible as the electrical devices 30.

It should be noted that the communication path L1 and the communication paths L2 may be wireless paths or wired paths, and may be communication paths that are capable of bidirectional communication such as with IP communication, or communication paths that are capable of communicating in one direction such as with the transmission and reception of signals by infrared remote control. Furthermore, the information processing apparatus 10 is not restricted to being constituted by a home server in the living space 1, and may be constituted by an external web server within the residence. Furthermore, the smart distribution board 20 may include the functions of the information processing apparatus 10 and also carry out the role of the information processing apparatus 10, and the electrical devices 30 may include the functions of the information processing apparatus 10 and also carry out the role of the information processing apparatus 10.

Figure 7:
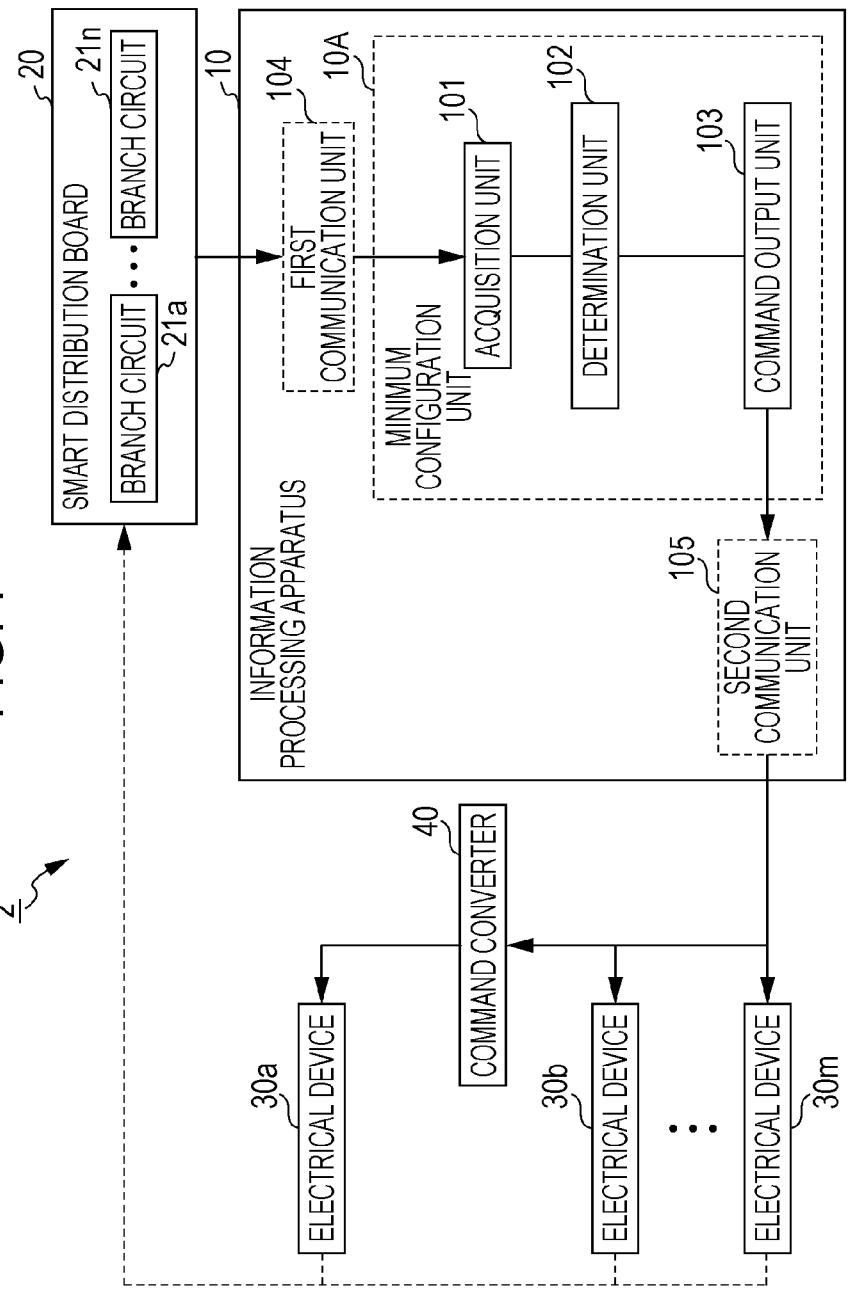
FIG. 7 is a block diagram depicting an example of the functional configuration of the network system in Embodiment 1.

FIG. 7 is a block diagram depicting an example of the functional configuration of the network system 2 in Embodiment 1.

[Configuration of Smart Distribution Board 20]

The smart distribution board 20 is provided with a plurality of branch circuits 21. In the example depicted in FIG. 7, the smart distribution board 20 is provided with n number of branch circuits 21a to 21n. The smart distribution board 20 measures the power amount supplied to and consumed by each of the n number of branch circuits 21a to 21n. The smart distribution board 20 transmits power information indicating the power amount measured (amount of power consumed) to the information processing apparatus 10.

The plurality of branch circuits 21 are an example of a plurality of circuits, have one or more electrical devices 30 respectively connected thereto, and supply power to the one or more electrical devices 30 connected. The power supplied by the plurality of branch circuits 21 is consumed in the electrical devices 30 respectively connected thereto. In the example depicted in FIG. 7, the electrical devices 30a to 30m are respectively connected to any of the plurality of branch circuits 21 and consume power that is supplied from the connected branch circuits 21.

[Configuration of Information Processing Apparatus 10]

As depicted in FIG. 7, the information processing apparatus 10 is provided with an acquisition unit 101, a determination unit 102, a command output unit 103, a first communication unit 104, and a second communication unit 105. Here, a minimum configuration unit 10A of the information processing apparatus 10 is configured of the acquisition unit 101, the determination unit 102, and the command output unit 103.

The first communication unit 104 communicates with the smart distribution board 20 and receives power information measured by the smart distribution board 20. In the present embodiment, the first communication unit 104 communicates with the smart distribution board 20 and receives power information that indicates the power amount supplied by each of the plurality of branch circuits 21 measured by the smart distribution board 20.

The second communication unit 105 communicates with the electrical devices 30 and outputs commands that cause the states of the electrical devices 30 to change. In the present embodiment, the second communication unit 105 outputs commands that cause a change in the power consumption of the electrical devices 30 to occur, as commands that cause the states of the electrical devices 30 to change.

The command output unit 103 outputs a command that causes a change in power consumption with respect to one electrical device 30.

In the present embodiment, the command output unit 103 outputs a command that causes a change in power consumption with respect to one electrical device 30, via the second communication unit 105 when a steady state is determined by the determination unit 102. The command that causes a change in power consumption with respect to the one electrical device 30 may be a command that causes the power source state of the one electrical device 30 to change from OFF to ON, and may be a command that causes the power source state of the one electrical device 30 to change from ON to OFF.

It should be noted that there are cases where the electrical devices 30 are not able to understand a command output by the information processing apparatus 10 due to the types of the electrical devices 30 and the information processing apparatus 10. In such cases, the information processing apparatus 10 may send a command via a command converter 40 depicted in FIG. 7, for example. It is assumed that the electrical devices 30 are capable of receiving an infrared signal issued from an accessory remote control but are not capable of carrying out IP communication or the like by way of a LAN, and that the information processing apparatus 10 does not have communication capability besides IP communication by way of a LAN, for example. In this case, the electrical devices 30 are not able to understand the command despite the information processing apparatus 10 sending the command directly to the electrical devices 30, and therefore the electrical devices 30 are not able to carry out an operation that causes the power consumption to change. However, the information processing apparatus 10 may issue a command using IP communication by way of a LAN and send the command via the command converter 40. The command converter 40 converts the command received by IP communication into an infrared signal and transmits the converted infrared signal to the electrical devices 30. Thus, the information processing apparatus 10 outputs the command to the electrical devices 30 albeit indirectly, and is thereby able to cause a change in power consumption in the electrical devices 30.

It should be noted that when the information processing apparatus 10 is not able to issue a command to the electrical devices 30 directly, the command output unit 103 may issue a command that outputs a message prompting the user to carry out a specific operation, to an electrical device (not depicted) provided with a user interface such as a display or a speaker. A possible example is a command that causes a message stating "Please turn on the electrical devices 30" to be displayed on the display of the electrical device provided with the user interface. Another possible example is a command that causes an audio message stating "Please turn on the electrical devices 30" to be output by the speaker of the electrical device provided with the user interface. As a result of the user following the instruction of this message, the operating states of the electrical devices 30 can be changed, and a change in power consumption can be caused in the electrical devices 30 albeit indirectly. Examples of electrical devices provided with a user interface include portable telephones such as smartphones, televisions, tablets, music players, digital recorders, and personal computers. It should be noted that the transmission of a command signal for an electrical device having a user interface may be carried out directly by IP communication. Furthermore, as another method for transmitting a command signal, a command may be temporarily issued to an Internet server from the information processing apparatus 10, and the command information issued by the information processing apparatus 10 may be transmitted when the electrical device provided with the user interface is connected to the server.

The acquisition unit 101 acquires power information indicating the power amount supplied by each of the plurality of branch circuits 21 to which one or more of the electrical devices 30 are respectively connected. In the present embodiment, the acquisition unit 101 acquires power information of each branch circuit 21 of the smart distribution board 20 via the first communication unit 104.

The determination unit 102 determines the connection relationship between one electrical device 30 and the branch circuit 21 to which the one electrical device 30 is connected, on the basis of the plurality of items of power information acquired by the acquisition unit 101. The determination unit 102 determines whether or not the state of the power amounts supplied by the plurality of branch circuits 21 is a steady state from the plurality of items of power information acquired by the acquisition unit 101, and causes the command output unit 103 to output a command for the one electrical device 30 when it is determined that the state of the power amounts supplied by the plurality of branch circuits 21 is a steady state. The determination unit 102 then determines the connection relationship by specifying that the branch circuit 21 corresponding to the power information that includes the change in power consumption corresponding to the command that was output by the command output unit 103, from among the plurality of items of power information acquired by the acquisition unit 101, is the branch circuit 21 to which the one electrical device 30 is connected. By repeating this kind of determination, the determination unit 102 is able to determine the correspondence relationship between each of the plurality of branch circuits 21 and one or more electrical devices 30 connected to the plurality of branch circuits 21.

Figure 8:
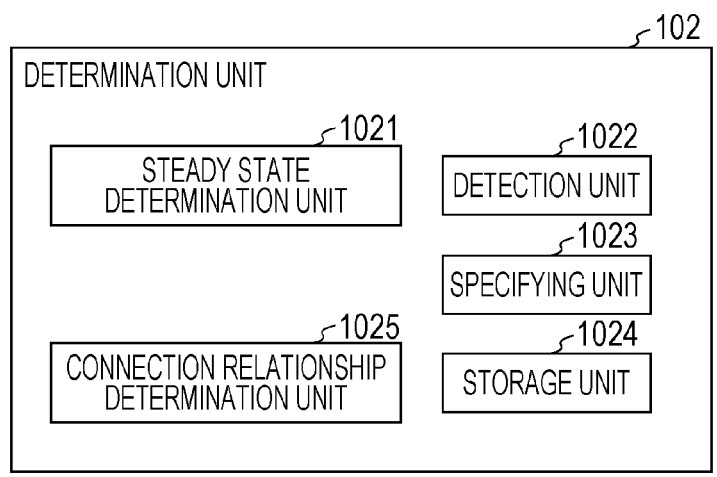
FIG. 8 is a block diagram depicting an example of the detailed configuration of a determination unit in Embodiment 1.

FIG. 8 is a block diagram depicting an example of the detailed configuration of the determination unit 102 in Embodiment 1.

In the present embodiment, as depicted in FIG. 8, the determination unit 102 is provided with a steady state determination unit 1021, a detection unit 1022, a specifying unit 1023, a storage unit 1024, and a connection relationship determination unit 1025.

The steady state determination unit 1021 determines whether or not the state of the power amounts supplied by the plurality of branch circuits 21 is a steady state from the plurality of items of power information acquired by the acquisition unit 101. In short, the steady state determination unit 1021 carries out processing (steady state determination processing) that determines whether or not a state has been entered in which it is possible to observe a change in power consumption corresponding to a command to be output thereafter by the command output unit 103, with respect to each of the branch circuits 21 on the basis of the plurality of items of power information acquired by the acquisition unit 101. In the present embodiment, for example, when the fluctuation in the power amounts supplied by each of the plurality of branch circuits 21 in a prescribed period is equal to or less than a predetermined value, the steady state determination unit 1021 determines that the state of the power amounts supplied by the plurality of branch circuits 21 is a steady state. Furthermore, as another example, it may be determined that the state of the power amounts supplied by the plurality of branch circuits 21 is a steady state when the power amounts supplied by each of the plurality of branch circuits 21 in a fixed period do not deviate from within a range defined by a predetermined upper limit value and lower limit value.

When it is determined by the steady state determination unit 1021 that the state of the power amounts supplied by the plurality of branch circuits 21 is a steady state, the detection unit 1022 causes a command for one electrical device 30 to be output by the command output unit 103. The detection unit 1022 then detects power information that includes a change in power corresponding to the command output by the command output unit 103, from among the plurality of items of power information acquired by the acquisition unit 101 after the output of the command.

More specifically, first, the detection unit 1022 causes a command to be output by the command output unit 103 when it is determined by the steady state determination unit 1021 that the state of the power amounts supplied by the plurality of the branch circuits 21 is a steady state. After the command output unit 103 has output the command, the acquisition unit 101 once again acquires power information of the smart distribution board 20 via the first communication unit 104. Thereafter, the detection unit 1022 carries out processing (unsteadiness detection processing) that detects power information that exhibits unsteadiness from among the power information acquired from each of the branch circuits 21. Here, power information that exhibits unsteadiness is power information that includes a change in power consumption corresponding to the command, for example.

In the present embodiment, the detection unit 1022 detects power information that includes a power change in which the absolute value of a time difference change amount for a power amount is equal to or greater than a predetermined value within a prescribed time period from the time at which the command output unit 103 issued the command, as power information that includes a change in power consumption corresponding to the command.

For example, when the command issued to the one electrical device 30 is an instruction that turns the power source state of the one electrical device from OFF to ON, the detection unit 1022 detects power information that includes a power change amount that has increased by a fixed amount or more within the prescribed time period from the time at which the command output unit 103 issued the command. Furthermore, contrastingly, for example, when the command issued to the one electrical device 30 is an instruction that turns the power source state of the one electrical device from ON to OFF, the detection unit 1022 may detect power information in which the absolute value of the power change amount decreases by a fixed amount or more within the prescribed time period from the time at which the command output unit 103 issued the command.

It should be noted that the detection unit 1022 may detect power information that includes a value that is outside of a range defined by a predetermined upper limit value and lower limit value, within the prescribed time period from the time at which the command output unit 103 issued the command, as power information that includes a change in power consumption corresponding to the command.

For example, when the command issued to the one electrical device 30 is an instruction that turns the power source state of the one electrical device from OFF to ON, the detection unit 1022 may detect power information that includes a power amount value that exceeds a predetermined upper limit value from the time at which the command output unit 103 issued the command. Furthermore, contrastingly, for example, when the command issued to the one electrical device 30 is an instruction that turns the power source state of the one electrical device from ON to OFF, the detection unit 1022 may detect power information that includes a power amount value that has fallen below a predetermined lower limit value within the prescribed time period from the time at which the command output unit 103 issued the command.

It should be noted that a database (not depicted) in which the correlations between the electrical devices 30, device operations, and power consumption changes are accumulated may be connected to be determination unit 102, and the detection unit 1022 may detect power consumption changes included in the database, as power information that includes changes in power consumption corresponding to the command.

For example, when the DB includes information such as an electrical device being a "lighting device", a device operation being "turn from OFF to ON", and a power consumption change being "power consumption increases from 80 to 110 w within 1 minute and thereafter becomes a fixed power consumption", the detection unit 1022 outputs the power information of "power consumption increases from 80 to 110 w within 1 minute and thereafter becomes a fixed power consumption" as power information that includes a change in power consumption corresponding to the command. It should be noted that the level of detail of the electrical device information accumulated in the DB may be that of a general product classification such as "washing machine" or "rice cooker", and may be a more detailed as in "washing machine model number XXX-XX made by Company A".

The specifying unit 1023 specifies the branch circuit 21 corresponding to the power information detected by the detection unit 1022 as being the circuit to which the one electrical device 30 is connected.

The storage unit 1024 stores the association between the branch circuits 21 specified by the specifying unit 1023 and the one electrical device 30.

The connection relationship determination unit 1025 determines the connection relationship between the one electrical device and the circuit to which the one electrical device is connected, on the basis of the association stored in the storage unit 1024. Furthermore, the connection relationship determination unit 1025 determines the connection relationship between each of the plurality of branch circuits 21 and one or more electrical devices 30 connected to the plurality of branch circuits 21, on the basis of associations stored in the storage unit 1024.

Figure 9:
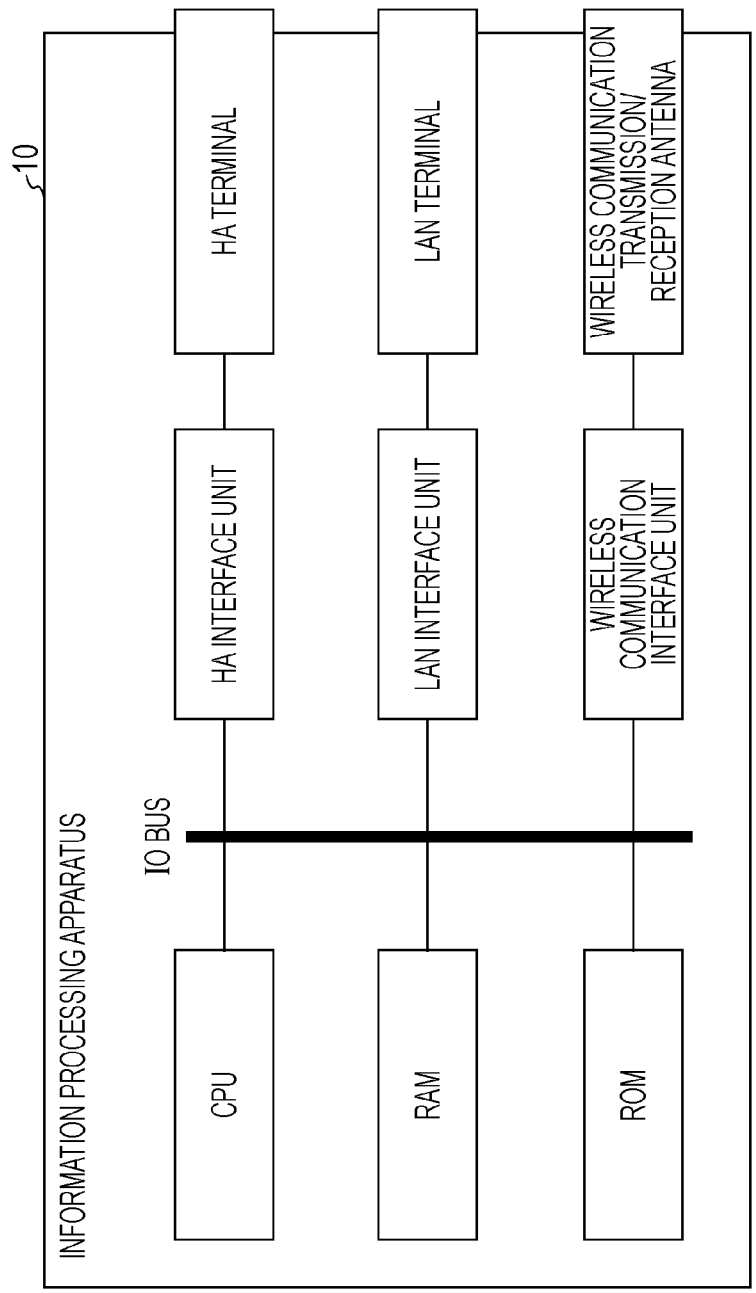
FIG. 9 is a block diagram depicting an example of the hardware configuration of an information processing apparatus in Embodiment 1.

FIG. 9 is a block diagram depicting an example of the hardware configuration of the information processing apparatus 10 in Embodiment 1.

As depicted in FIG. 9, the information processing apparatus 10 is configured of a CPU, a RAM, a ROM, a home automation (HA) interface unit, an HA terminal, a LAN interface unit, a LAN terminal, a wireless communication interface unit, and a wireless communication transmission/reception antenna.

The CPU, RAM, ROM, HA interface unit, LAN interface unit, and wireless communication interface unit are connected to each other via an IO bus.

The CPU executes a program stored in the ROM, and the information processing apparatus 10 carries out integrated control. The RAM is used as a work area for the CPU. The ROM stores the program executed by the CPU. The HA terminal is a JEM-A terminal, for example. Here, the JEM-A terminal is an HA terminal that conforms with the JEMA (The Japan Electrical Manufacturers' Association) unified standard. In the present embodiment, the HA terminal is a JEM 1427, for example. The HA interface unit is configured of a communication circuit that conforms with the standard for the JEM-A terminal, for example.

The LAN terminal is a LAN terminal such as a 1000BASE-T or a 100BASE-TX, for example. The LAN interface unit is configured of a communication circuit that conforms with a wired LAN communication standard such as IEEE 802.3, for example. In the present embodiment, the LAN interface unit and the LAN terminal mainly communicate with the electrical devices 30 and the smart distribution board 20. It should be noted that the LAN interface unit may be a communication circuit that conforms with a wireless LAN communication standard such as the IEEE 802.11 series. In this case, a wireless LAN antenna may be adopted as the LAN antenna.

The wireless communication transmission/reception antenna is constituted by, for example, an antenna that conforms with Digital Enhanced Cordless Telecommunications (DECT), which is a communication standard for digital cordless telephones.

[Operation of Network System]

Next, the operation of the network system 2 in Embodiment 1 configured as mentioned above will be described.

Figure 10:
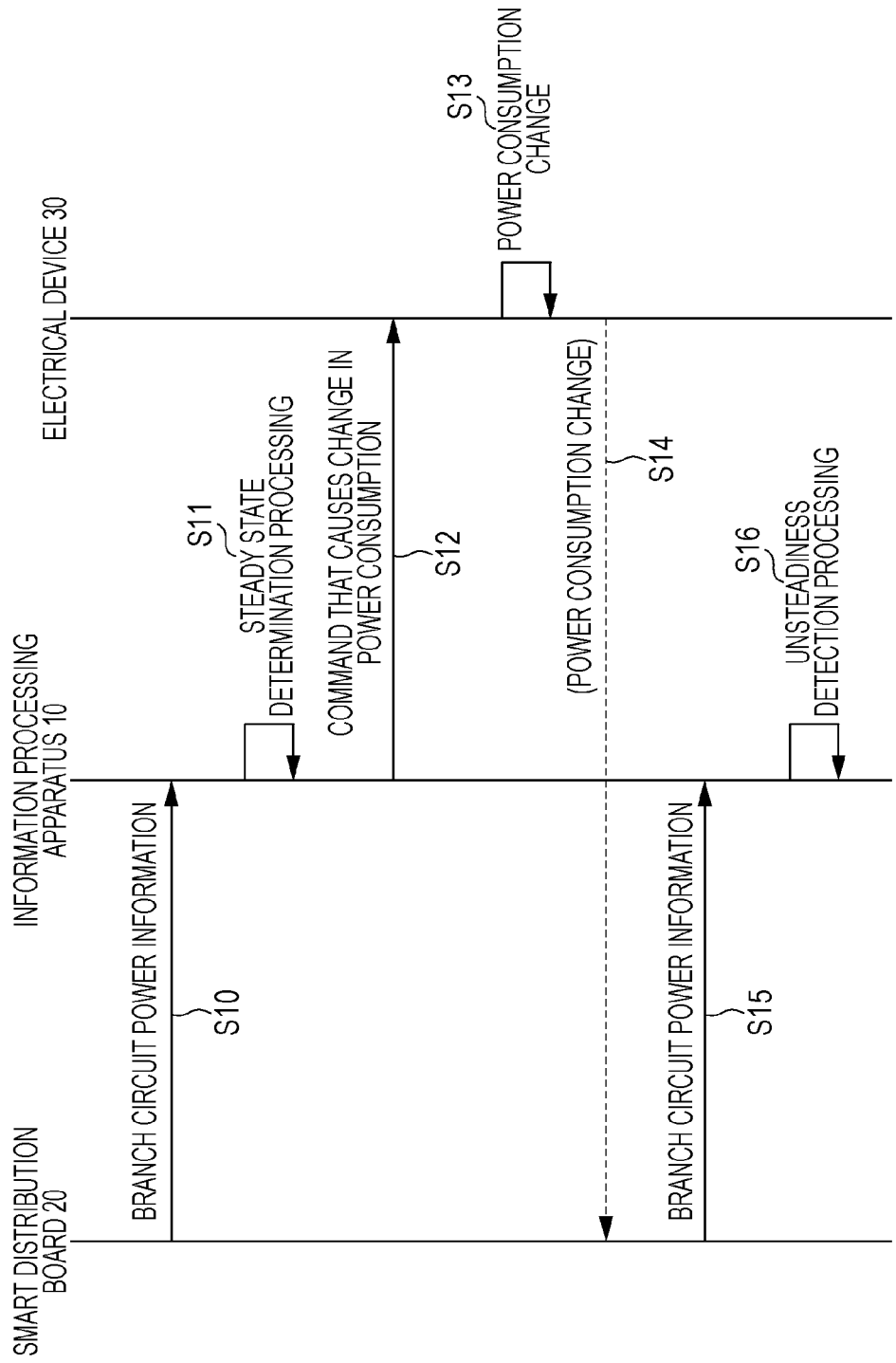
FIG. 10 is a sequence diagram depicting an operation summary for the network system in Embodiment 1.

FIG. 10 is a sequence diagram depicting an operation summary for the network system 2 in Embodiment 1.

First, the information processing apparatus 10 acquires, from the smart distribution board 20, power information indicating a power amount supplied by each of the plurality of branch circuits 21 to which one or more electrical devices are respectively connected (S10).

Next, the information processing apparatus 10 carries out steady state determination processing (511). Specifically, the information processing apparatus 10 determines, from the plurality of items of power information acquired, whether or not the state of the power amounts supplied by the plurality of branch circuits 21 (all of the branch circuits 21) is a steady state.

When it is determined that the state of the power amounts supplied by the plurality of branch circuits 21 is a steady state, the information processing apparatus 10 outputs a command that causes a change in power consumption with respect to one electrical device 30 (S12).

Next, the one electrical device 30 carries out an operation that causes a change in power consumption, in accordance with the command (S13). Here, the smart distribution board 20 retains power information obtained by measuring the power amount supplied to and consumed by each of the branch circuits 21. Since the one electrical device 30 is connected to any of the plurality of branch circuits 21, power information that includes a change in power consumption (S14) caused by the one electrical device 30 is included among the plurality of items of power information retained by the smart distribution board 20.

Next, the information processing apparatus 10 carries out unsteadiness detection processing on the basis of the plurality of items of power information acquired (S16). Specifically, the information processing apparatus 10 detects power information that includes the detected change in power consumption corresponding to the command, from among the plurality of items of power information acquired.

The information processing apparatus 10 then specifies the branch circuit 21 corresponding to the power information that includes the detected change in power consumption corresponding to the command, as being the branch circuit 21 to which one electrical device 30 is connected.

By repeating this kind of processing (S10 to S16), the information processing apparatus 10 is able to determine the connection relationships between the plurality of branch circuits 21 and the one or more electrical devices 30.

[Detailed Operation of Information Processing Apparatus]

Next, the details of the processing carried out by the information processing apparatus 10 will be described.

Figure 11:
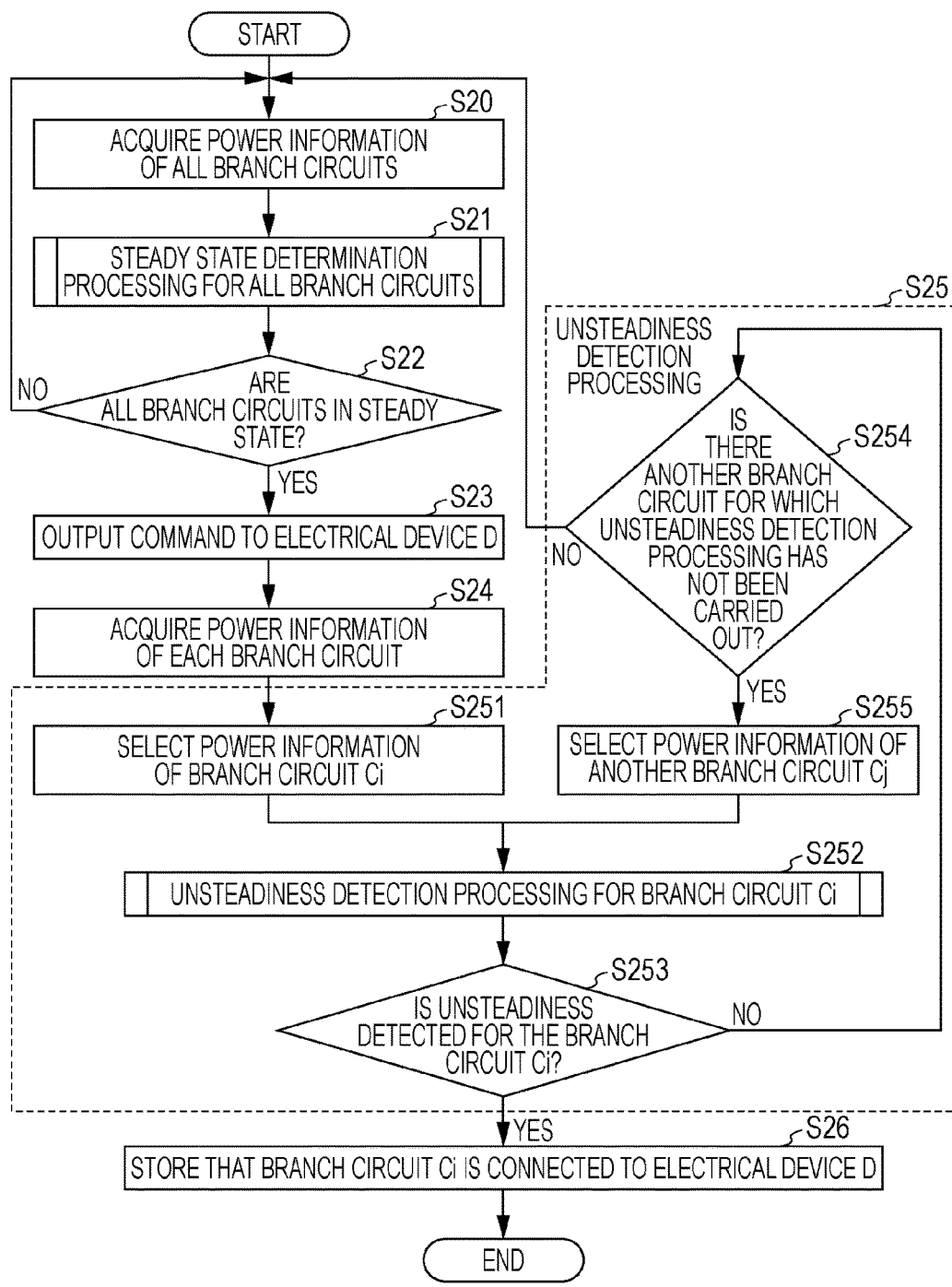
FIG. 11 is a flowchart depicting an example of the operation of the information processing apparatus in Embodiment 1.

FIG. 11 is a flowchart depicting an example of the operation of the information processing apparatus 10 in Embodiment 1.

Hereinafter, a description will be given regarding an operation in the case where the information processing apparatus 10 determines the connection relationship between a branch circuit 21 and an electrical device 30 connected to the branch circuit 21, according to an operation performed by the user or periodically.

First, the information processing apparatus 10 acquires the power information of all of the branch circuits 21 (S20). More specifically, the information processing apparatus 10 acquires, from the smart distribution board 20, power information that indicates the power amount supplied by each of the plurality of branch circuits 21 to which one or more electrical devices are respectively connected.

Next, the information processing apparatus 10 carries out steady state determination processing for all of the branch circuits 21 (S21). More specifically, the information processing apparatus 10 determines whether or not the state of the power amounts supplied by all of the branch circuits 21 is a steady state, from all of the acquired power information of all of the branch circuits 21.

When it is determined that all of the branch circuits 21 are in a steady state (yes in S22), the information processing apparatus 10 outputs a command that causes a change in power consumption with respect to an electrical device D that is one of the electrical devices 30 (S23). More specifically, when it is determined that the state of the power amounts supplied by the plurality of branch circuits 21 is a steady state, the information processing apparatus 10 outputs a command that causes a change in power consumption with respect to one electrical device 30 (indicating as electrical device D in the drawings).

In the present embodiment, a situation where all of the branch circuits 21 are in a steady state includes the case where there is little fluctuation (fluctuation is equal to or less than a predetermined value) in the power amounts indicated by the power information of all of the branch circuits 21, and the case where there is little fluctuation in the total power amount for the power amounts indicated by the power information of all of the branch circuits 21. Here, the drawings will be used to describe the case where it is determined that one of the branch circuits 21 is in a steady state.

Figure 12A:
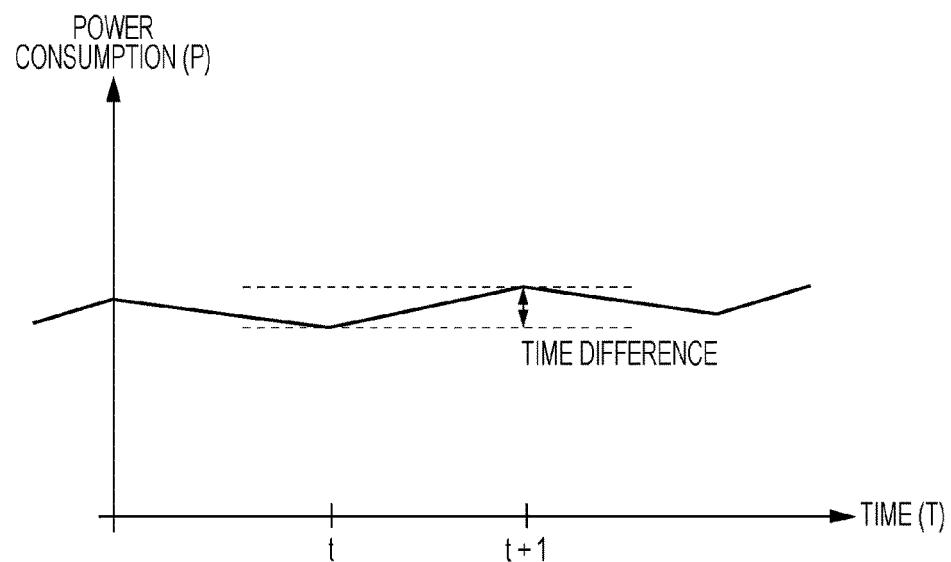
FIG. 12A is a drawing depicting an example of when it is determined that one branch circuit in Embodiment 1 is in a steady state.
Figure 12B:
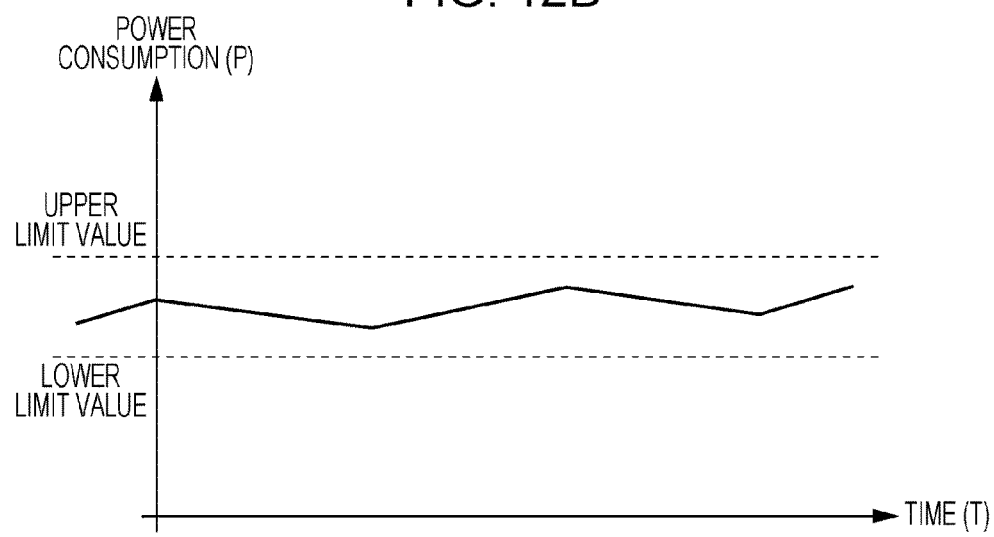
FIG. 12B is a drawing depicting an example of when it is determined that one branch circuit in Embodiment 1 is in a steady state.

FIGS. 12A and 12B are drawings depicting an example of the case where it is determined that the one of the branch circuits 21 in Embodiment 1 is in a steady state. FIGS. 12A and 12B depict fluctuations in the power amount indicated by the power information of one branch circuit 21. According to FIG. 12A, a power amount time difference value is small, and the power amount time difference value is equal to or less than a predetermined value. According to FIG. 12B, the value of a power amount P does not include values outside of a range defined by a predetermined lower limit value and upper limit value. In short, FIGS. 12A and 12B depict an example of the case where there is little fluctuation in the power amount in a prescribed period indicated by the power information of one branch circuit 21, as the case where one branch circuit 21 is in a steady state. It should be noted that the case where there is little fluctuation in the power amount also includes when there is no fluctuation (when the power amount is fixed).

Hereinafter, the description will be continued returning to FIG. 11.

In S22, the information processing apparatus 10 returns to S20 if it is determined that all of the branch circuits 21 are not in a steady state (no in S21). More specifically, the information processing apparatus 10 returns to S20 if it is determined that at least one from among the power amounts indicated by the power information of all of the branch circuits 21 is not in a steady state, or if it is determined that the total power amount of the power amounts indicated by the power information of all of the branch circuits 21 is not in a steady state.

Next, the information processing apparatus 10 once again acquires the power information of each branch circuit 21 (S24) and carries out unsteadiness detection processing (S25). More specifically, in S25, first, the information processing apparatus 10 selects one item of power information (branch circuit Ci) from among all of the branch circuits 21 (S251). Next, the information processing apparatus 10 carries out unsteadiness detection processing for the branch circuit Ci (S252). In S252, the information processing apparatus 10 determines whether or not a change in power consumption that corresponds to a command output to the electrical device D is included in the power information of the branch circuit Ci. For example, the information processing apparatus 10 determines whether or not the absolute value of a time difference change amount for the power amount indicated by the power information of the branch circuit Ci in a prescribed time period from the time at which the command was issued is equal to or greater than a predetermined value, or determines whether the power amount is a value outside of the range defined by the predetermined lower limit value and upper limit value. Next, if unsteadiness is detected in the power information of the branch circuit Ci (yes in S253), the information processing apparatus 10 specifies that the branch circuit Ci is the branch circuit connected to the electrical device D, stores that association (S26), and the processing ends.

However, if unsteadiness is not detected in the power information of the branch circuit Ci in S253 (no in S253), the information processing apparatus 10 determines whether or not there is a branch circuit for which unsteadiness detection processing has not been carried out (S254). If there is no branch circuit for which unsteadiness detection processing has not been carried out (no in S254), the processing returns to S20 and is repeated.

However, in S254, if there is a branch circuit for which the information processing apparatus 10 has not carried out unsteadiness detection processing (yes in S254), the information processing apparatus 10 selects the power information of the one branch circuit Cj that is different from the branch circuit Ci from among all of the branch circuits 21 (S255). The processing thereafter is the same as previously mentioned and a description thereof is therefore omitted.

[Effects Etc. of Embodiment 1]

As described above, according to the present embodiment, an information processing method, an information processing apparatus, and a recording medium having a program recorded thereon, with which it is possible to more reliably determine the connection relationship between a circuit that supplies power and an electrical device that is connected to that circuit, are realized.

More specifically, a steady state in which the power consumption changes of an electrical device are able to be measured is determined first, and thereafter a power change is caused in the electrical device. It is thereby possible to specify that the circuit corresponding to power information including the change in power consumption made to occur is the circuit that is connected to the electrical device, on the basis of the power information of a plurality of circuits that include the circuit to which the electrical device is connected. In this way, a power change is caused in the electrical device and it is thereby possible to determine the connection relationship between the electrical device and the circuit to which the electrical device is connected. Then, by repeating this kind of determination, it is possible to determine the connection relationships between the plurality of electrical devices and one or more electrical devices. It should be noted that, as described above, the power source state of an electrical device may be turned from OFF to ON or turned from ON to OFF as the power change in the electrical device, for example.

In this way, according to the information processing method and the like of the present embodiment, it is possible to more reliably observe power changes of an electrical device connected to a branch circuit, and it is therefore possible to specify the connection relationship between the branch circuit and the electrical device connected to the branch circuit, on the basis of the electrical device to which a command is issued and the timing of that power change.

Embodiment 2

In Embodiment 1, a description was given regarding an example of when a state in which there is a fluctuation in a power amount measured by a branch circuit but the fluctuation is within a fixed range is determined as a steady state. In the present embodiment, a description will be given regarding the case where a steady state can be determined also when the power amount measured by a branch circuit regularly changes.

Figure 13:
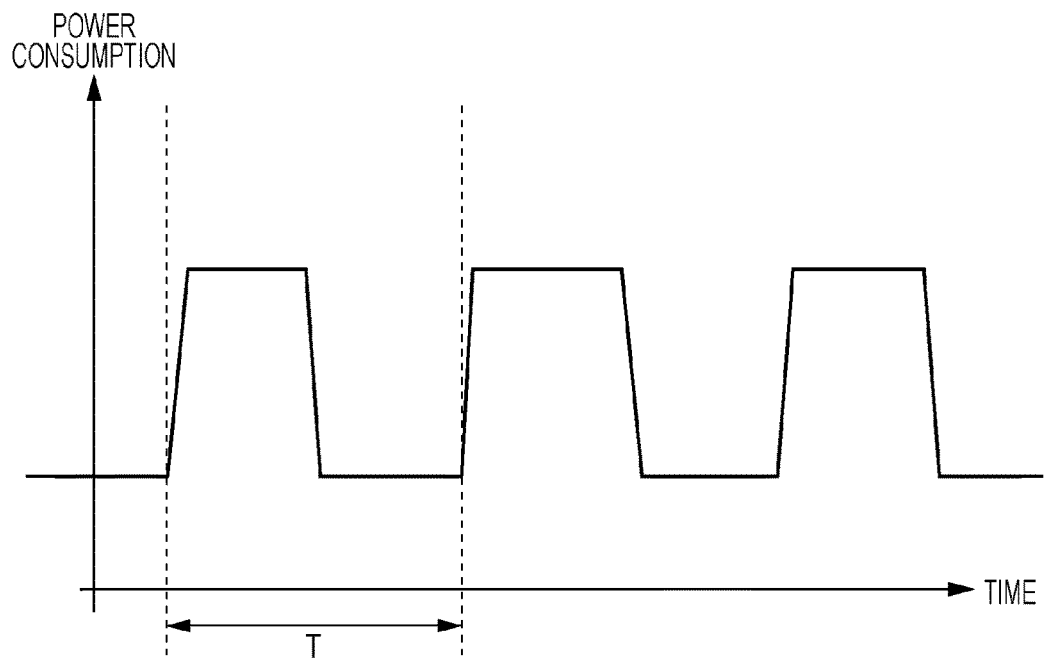
FIG. 13 is a drawing depicting regular changes in power consumption exhibited by an electrical device in Embodiment 2.

FIG. 13 is a drawing depicting regular changes in power consumption exhibited by an electrical device in Embodiment 2.

For example, when the electrical device is a refrigerator, according to the type of refrigerator, there are cases where an intermittent operation is carried out in which a compressor for performing cooling repeatedly operates and stops in a periodic manner. In this case, the power consumption of the refrigerator increases when the compressor is operating and decreases when the compressor has stopped. When the door of the refrigerator is not being opened and closed and when the external temperature is stable, the change in the power consumption of the refrigerator repeatedly increases and decreases in a fixed period T as depicted in FIG. 13, for example.

It should be noted that this is not restricted to the case where the electrical device is a refrigerator, and there are cases where power consumption changes in a regular manner also when the electrical device is a video recorder or a television. For example, although the operating state of a video recorder or a television is ordinarily in a power-saving mode, there are also cases where power consumption is deemed to change in a regular manner such as when an operating state is entered in which power consumption is high for a fixed time period due to data for an electronic program table being received at the same time each day.

[Configuration Etc. of Information Processing Apparatus]

When the power consumption of an electrical device is changing in a regular manner in a prescribed period, the information processing apparatus in the present embodiment determines that the state of the power amount consumed by the electrical device is a steady state. It should be noted that, in the information processing apparatus in the present embodiment, the configuration of a determination unit 102A is different with respect to the information processing apparatus 10 in Embodiment 1.

Figure 14:
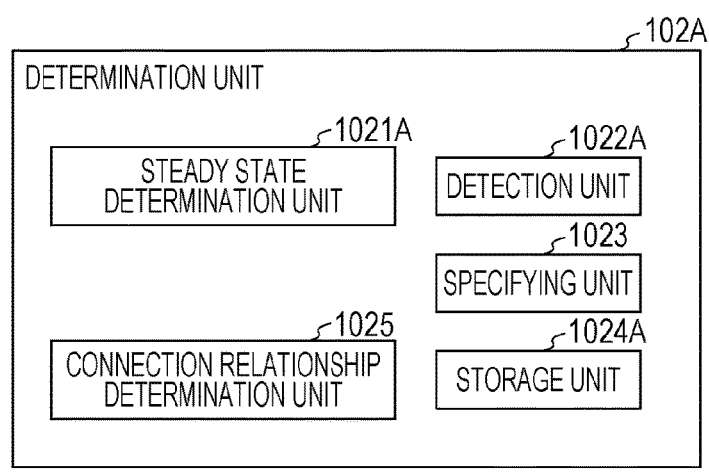
FIG. 14 is a block diagram depicting an example of the detailed configuration of a determination unit in Embodiment 2.

FIG. 14 is a block diagram depicting an example of the detailed configuration of the determination unit 102A in Embodiment 2. The same reference numbers have been appended to the same elements as in FIG. 8 and detailed descriptions thereof have been omitted. In the determination unit 102A depicted in FIG. 14, the operations of a steady state determination unit 1021A, a detection unit 1022A, and a storage unit 1024A are different with respect to the determination unit 102 depicted in FIG. 8.

The storage unit 1024A stores an association between a branch circuit 21 specified by the specifying unit 1023 and the one electrical device 30. In the present embodiment, in addition, the storage unit 1024A stores a prescribed pattern used for determination by the steady state determination unit 1021A. Here, the prescribed pattern is data (stored data) that indicates a regular power change pattern such as that depicted in FIG. 12, for example.

The steady state determination unit 1021A determines whether or not the state of the power amounts supplied by the plurality of branch circuits 21 is a steady state, from a plurality of items of power information acquired by the acquisition unit 101. In the present embodiment, when the fluctuation in a power amount supplied in a prescribed period by at least one branch circuit 21 from among the plurality of branch circuits 21 exhibits a prescribed pattern, the steady state determination unit 1021A determines that the state of the power amount supplied by at least the one branch circuit 21 is a steady state. When it is determined that the power amount supplied in the prescribed period by a plurality of branch circuits 21 excluding the at least one branch circuit 21 from among the plurality of branch circuits 21 is a steady state, the steady state determination unit 1021A determines that the state of the power amounts supplied by all of the branch circuits is a steady state.

Here, a description will be given regarding an example of a method in which the steady state determination unit 1021A determines that a fluctuation in the power amount supplied in a prescribed period by one branch circuit 21 exhibits a prescribed pattern.

Figure 15:
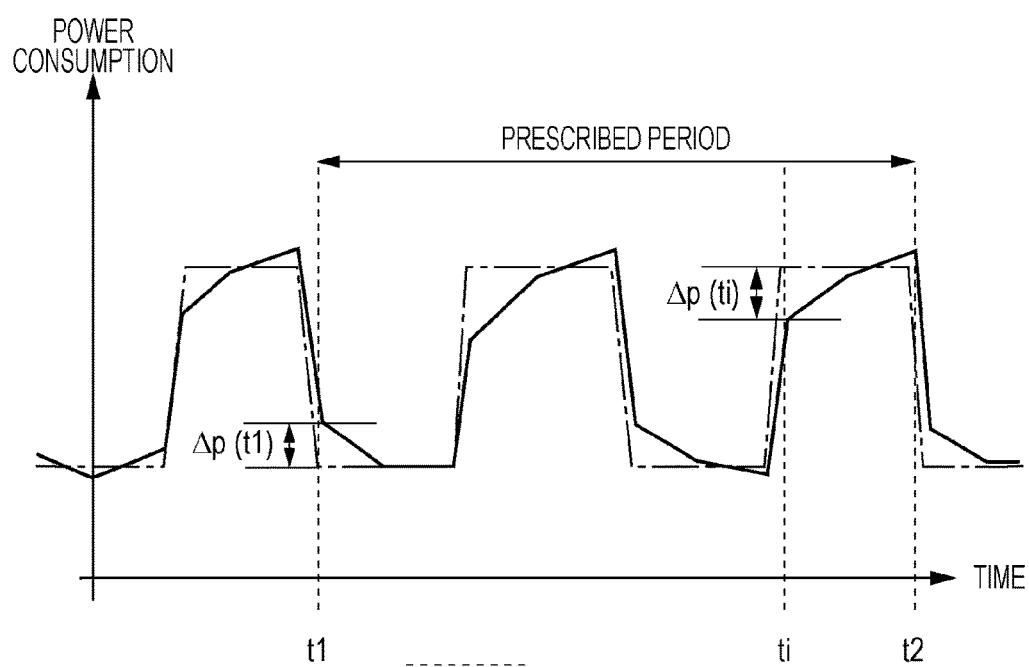
FIG. 15 is a drawing depicting an example of a power amount indicated by one item of power information acquired by an acquisition unit in Embodiment 2.
Figure 16A:
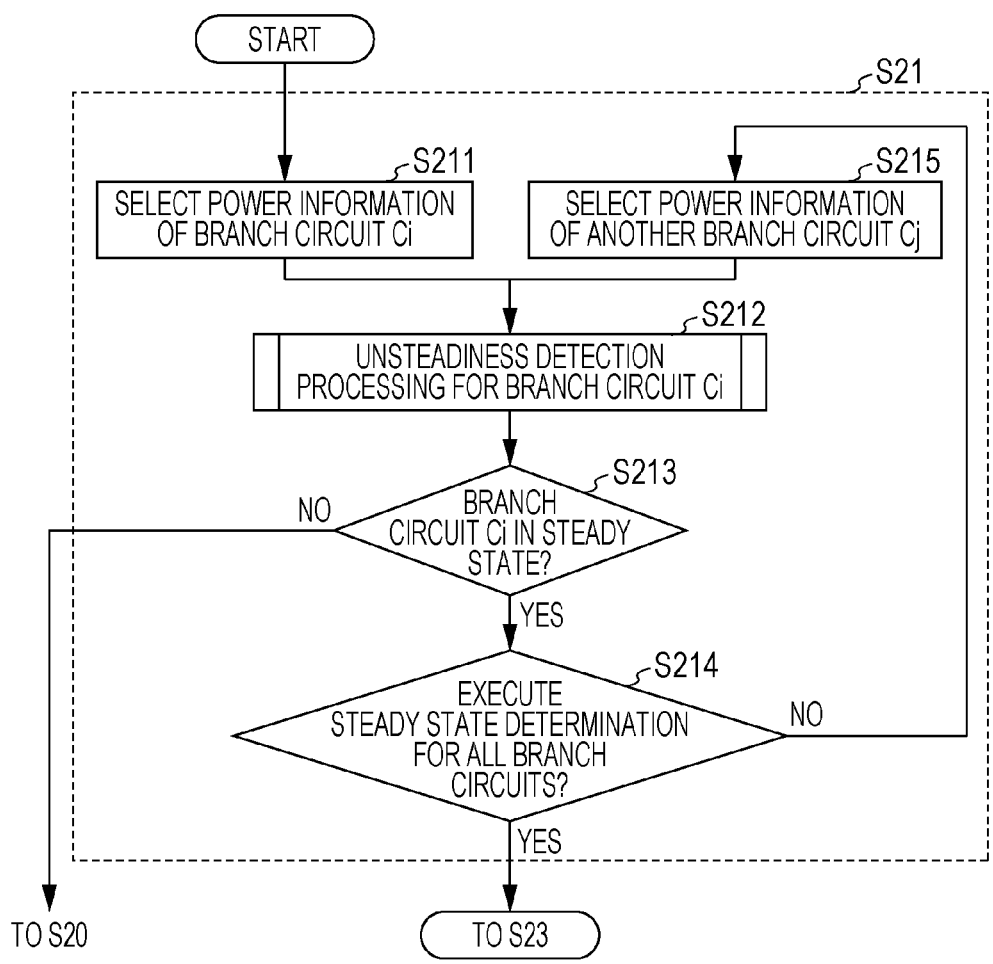
FIG. 16A is a flowchart depicting determination processing of a steady state determination unit in Embodiment 2.
Figure 16B:
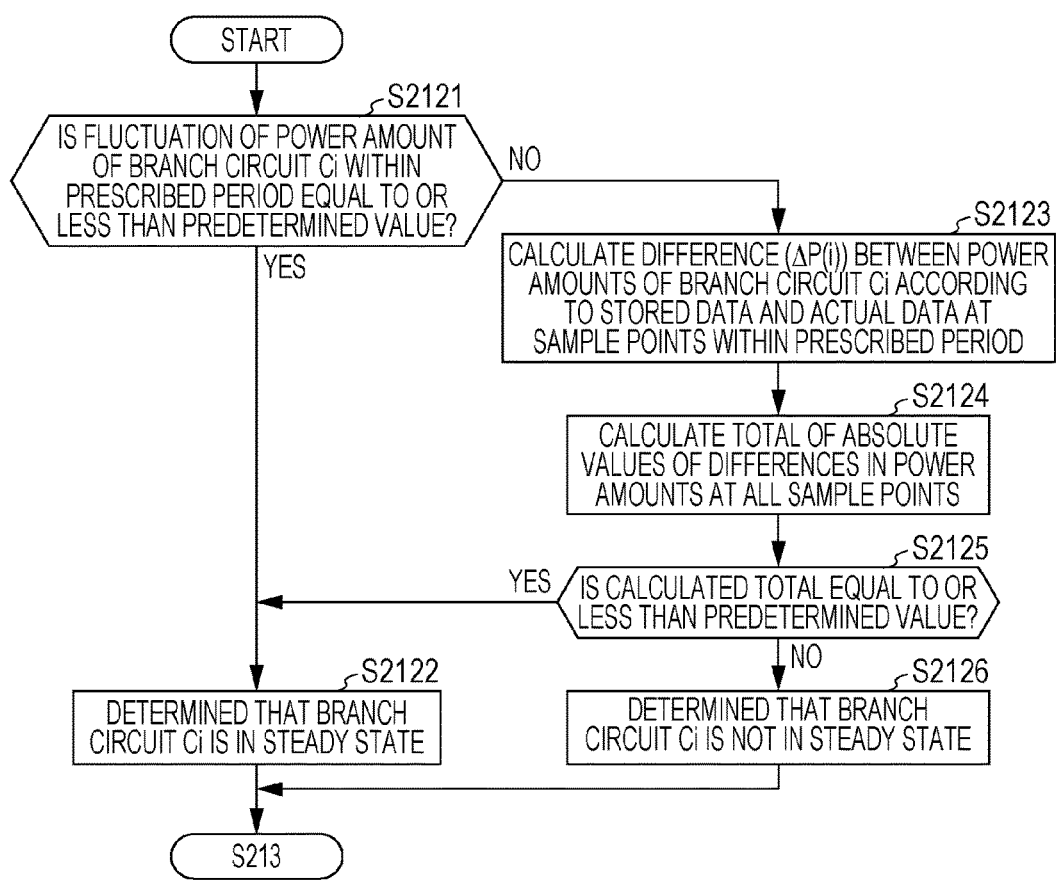
FIG. 16B is a flowchart depicting determination processing of the steady state determination unit in Embodiment 2.

FIG. 15 is a drawing depicting an example of a power amount indicated by one item of power information acquired by the acquisition unit 101 in Embodiment 2. It should be noted that the dot/dash line depicted in FIG. 15 is the prescribed pattern depicted in FIG. 13. FIGS. 16A and 16B are flowcharts depicting the determination processing of the steady state determination unit 1021A in Embodiment 2. It should be noted that, in FIGS. 16A and 16B, the same reference numbers have been appended to the same elements as in FIG. 11 and detailed descriptions thereof have been omitted.

The steady state determination unit 1021A determines the similarity between the prescribed pattern (stored data) stored in the storage unit 1024 and the power amount (actual data) indicated by one item of the power information acquired by the acquisition unit 101, and, if similar, determines that the power amount indicated by one item of power information acquired by the acquisition unit 101 exhibits the prescribed pattern. For example, when a value obtained by adding together the absolute values of the differences between the power amounts according to the stored data and the actual data at each time in the prescribed period is equal to or less than a predetermined value, the steady state determination unit 1021A determines that the power amount indicated by the one item of power information acquired by the acquisition unit 101 exhibits the prescribed pattern, and determines that the power amount indicated by the one item of power information is in a steady state.

This determination method will be described using FIGS. 15, 16A, and 16B.

In the steady state determination processing for all of the branch circuits of S21, the steady state determination unit 1021A first selects one item of power information (branch circuit Ci) from among all of the branch circuits 21 (S211).

Next, the steady state determination unit 1021A carries out steady state determination processing with respect to the branch circuit Ci (S212).

More specifically, in S212, first, the steady state determination unit 1021A determines whether a fluctuation in the power amount of the branch circuit Ci within the prescribed period is equal to or less than the predetermined value, as depicted in FIG. 16B (S2121). If that is the case (yes in S2121), the steady state determination unit 1021A determines that the power amount indicated by the power information of the branch circuit Ci is in a steady state, as described in Embodiment 1 (S2122).

However, in S2121, if the fluctuation of the power amount of the branch circuit Ci within the prescribed period is not equal to or less than the predetermined value (no in S2121), the steady state determination unit 1021A carries out the steady state determination processing of the present embodiment. In other words, the steady state determination unit 1021A calculates the difference ($\Delta P(i)$) between the power amounts according to the stored data and the actual data of the branch circuit Ci at sample points within the prescribed period (S2123), and calculates the total of the absolute values of the differences in the power amounts at all of the sample points (S2124). The steady state determination unit 1021A then determines whether or not the calculated absolute value total is equal to or less than a predetermined value (S2125). In FIG. 15, the prescribed period is the period between time t1 and time t2, for example, and the difference between the power amounts according to the stored data and the actual data at time t1 is indicated by $\Delta P(t1)$. The steady state determination unit 1021A obtains differences $\Delta P(ti)$ in power not only at time t1 but also at each time ti (each sample point), calculates a value obtained by adding together the absolute values of the differences $\Delta P(ti)$ in power amounts at the sample points between time t1 and time t2, and determines whether that value (absolute value total) is below the predetermined value.

In S2125, if the calculated absolute value total was equal to or less than the predetermined value (yes in S2125), the steady state determination unit 1021A determines that the power amount indicated by the power information of the branch circuit Ci is in a steady state (S2122).

Next, if the steady state determination unit 1021A has executed steady state determination processing with respect to the branch circuit Ci and not determined that the branch circuit Ci is in a steady state (no in S213), the processing proceeds to S20 of FIG. 11.

However, if the steady state determination unit 1021A has executed steady state determination processing with respect to the branch circuit Ci and determined that the branch circuit Ci is in a steady state (yes in S213), the steady state determination unit 1021A determines whether steady state determination for all of the branch circuits has been carried out (S214). If steady state processing has not yet been carried out for all of the branch circuits (no in S214), the power information of another branch circuit Cj is selected (S215), the processing returns to S212, and the processing of S212 is carried out. It should be noted that if the steady state determination unit 1021A has carried out steady state determination for all of the branch circuits (yes in S214), the processing proceeds to the processing of S20 of FIG. 11.

The aforementioned determination method has been described as a determination method in the case where one electrical device such as a refrigerator is connected to one branch circuit; however, it should be noted that the present disclosure is not restricted thereto. As long as it is possible to carry out determination according to a prescribed pattern such as that described above, the determination method can be applied even when a plurality of electrical devices are connected to one branch circuit.

If it is determined by the steady state determination unit 1021A that the state of the power amounts supplied by the plurality of branch circuits 21 is a steady state, the detection unit 1022A causes the command output unit 103 to output a command to one electrical device 30. The detection unit 1022A then detects power information that includes a time difference change amount for a power amount that is equal to or greater than a predetermined value, from among the power information of a plurality of branch circuits 21 excluding the at least one branch circuit 21 from among the plurality of branch circuits 21, within a prescribed time period from a time at which the command output unit 103 issued the command, as power information that includes a change in power consumption corresponding to the command. It should be noted that the detection unit 1022A may detect power information that includes a time difference change amount for a power amount that is equal to or greater than a predetermined value, on the basis of the prescribed pattern, from among the power information of the at least one branch circuit 21 within the prescribed time period, as power information that includes a change in power consumption corresponding to the command.

The specifying unit 1023 specifies the circuit corresponding to the detected power information as being the circuit to which the one electrical device is connected.

[Effects Etc. of Embodiment 2]

As described above, according to Embodiment 2, an information processing method, an information processing apparatus, and a recording medium having a program recorded thereon, with which it is possible to more reliably determine the connection relationship between a circuit that supplies power and an electrical device that is connected to that circuit, are able to be realized.

More specifically, in the steady state determination processing of Embodiment 1, the case where an electrical device such as a refrigerator that periodically repeats a change in power consumption is connected to any of the branch circuits and the measured power amount of the branch circuit is regularly fluctuating was not determined as a steady state. Contrastingly, in the steady state determination processing of Embodiment 2, it is possible for a steady state to be determined also when the power amount measured by a branch circuit regularly changes. In Embodiment 2, the electrical devices include devices that ordinarily exhibit changes in power consumption on a regular basis in a manner similar to a refrigerator or the like, and therefore, by learning the pattern of those power amount changes, it is possible to determine a steady state even with an electrical device that ordinarily exhibits changes in power consumption if similar to the learned pattern (prescribed pattern). It is then possible to determine connection relationships even when an electrical device such as a refrigerator that periodically repeats changes in power consumption is connected to a branch circuit, by determining connection relationships from the power amount information of all of the branch circuits with the power information that exhibits the power amount change pattern being temporarily excluded. Moreover, by negating this pattern and detecting power changes corresponding to the command in the power amount information that exhibits the power amount change pattern, it is possible to determine that the electrical device for which the command was output is connected to the branch circuit of that power amount information.

Embodiment 3

When many electrical devices are connected to one branch circuit, there are cases where power amount changes measured by the branch circuit are not very stable. In the present embodiment, a description will be given regarding a method with which a connection relationship can be determined even when there is a fluctuation in a power amount measured by a branch circuit and that fluctuation is irregular.

[Configuration Etc. of Information Processing Apparatus]

In the information processing apparatus in the present embodiment, the configuration of a determination unit 102B is different with respect to the information processing apparatus 10 in Embodiment 1.

Figure 17:
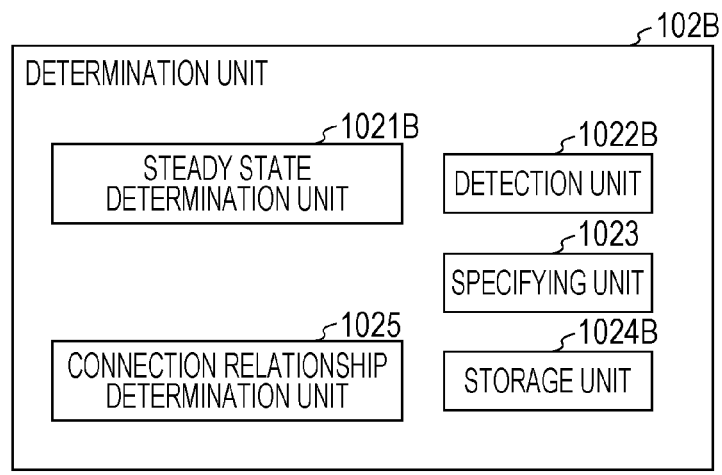
FIG. 17 is a block diagram depicting an example of the detailed configuration of a determination unit in Embodiment 3.

FIG. 17 is a block diagram depicting an example of the detailed configuration of the determination unit 102B in Embodiment 3. The same reference numbers have been appended to the same elements as in FIG. 8 and detailed descriptions thereof have been omitted. In the determination unit 102B depicted in FIG. 17, the operations of a steady state determination unit 1021B, a detection unit 1022B, and a storage unit 1024B are different with respect to the determination unit 102 depicted in FIG. 8.

The storage unit 1024B stores the association between a branch circuit 21 specified by the specifying unit 1023 and the one electrical device 30. In the present embodiment, in addition, the storage unit 1024B stores a specific pattern used for the determination by the steady state determination unit 1021B. Here, the specific pattern is a pattern assumed for changes in power consumption caused in the target electrical device 30 by a plurality of commands that are output to the target electrical device 30 by the command output unit 103. For example, when a command that causes a change in state from ON to OFF and a command that causes a change in state from OFF to ON are repeated in a fixed period and constitute a plurality of commands that are output to the target electrical device 30 by the command output unit 103, the specific pattern may be a pattern in which the same change in power amount is repeated a plurality of times in the fixed period.

The steady state determination unit 1021B determines whether or not the state of the power amounts supplied by the plurality of branch circuits 21 is a steady state, from a plurality of items of power information acquired by the acquisition unit 101. In the present embodiment, when fluctuations in the prescribed period in the power amount supplied by each of the plurality of branch circuits 21 do not match the specific pattern, the steady state determination unit 1021B determines that the state of the power amounts supplied by the plurality of branch circuits 21 is a steady state. Here, when fluctuations in the prescribed period in the power amount supplied by each of the plurality of branch circuits 21 are not similar to the specific pattern, the steady state determination unit 1021B may determine that the fluctuations do not match the specific pattern. Furthermore, when the time difference change amount for a value obtained by totaling, in each fixed period, the power amount in the prescribed period supplied by each of the plurality of circuits is equal to or less than a predetermined value, the steady state determination unit 1021B may determine that the fluctuations in the prescribed period in the power amount supplied by each of the plurality of branch circuits 21 do not match the specific pattern.

When it is determined by the steady state determination unit 1021B that the state of the power amounts supplied by the plurality of branch circuits 21 is a steady state, the detection unit 1022B causes a plurality of commands for one electrical device 30 to be output by the command output unit 103. The power consumption of the one electrical device 30 is changed according to the specific pattern by the plurality of commands output by the command output unit 103.

It should be noted that, as commands that cause a change in power consumption with respect to the one electrical device 30, the plurality of commands may be a command set for causing a change in power consumption with respect to the one electrical device 30, made up of a plurality of sets of a type and a time interval, for example. Furthermore, the objective of the plurality of commands is to cause a power consumption change pattern to occur in the one electrical device 30 by being output to the one electrical device 30. Therefore, the command output unit 103 may cause a change in power consumption that corresponds with the specific pattern by issuing a single command that is able to cause power consumption to change in the one electrical device 30, and may issue a command that instructs a simple operation change to the one electrical device 30 a plurality of times such that the specific pattern is followed.

Furthermore, the detection unit 1022B detects power information that matches the specific pattern, within a prescribed time period from the time at which the command output unit 103 issued the plurality of commands, as power information that includes a change in power consumption corresponding to the plurality of commands. More specifically, the detection unit 1022B examines the power information of the plurality of branch circuits 21 acquired by the acquisition unit 101, and detects power information that matches the power amount change pattern (specific pattern) that the plurality of commands issued by the command output unit 103 have attempted to generate.

The specifying unit 1023 specifies the circuit corresponding to the detected power information as being the circuit to which the one electrical device is connected.

[Command Set Example]

Next, a description will be given regarding a command set for causing a power consumption change of one target electrical device to occur according to a specific pattern.

Figures 18A, 18B:
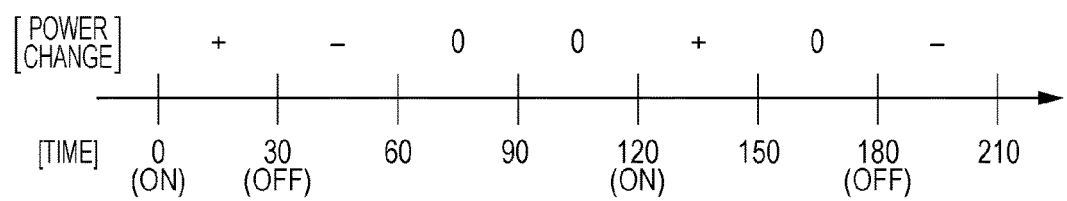
FIG. 18A is a drawing depicting an example of a command set in Embodiment 3.
FIG. 18B is a drawing depicting a power change pattern that is assumed when the command set depicted in FIG. 18A is issued.

FIG. 18A is a drawing depicting an example of a command set in Embodiment 3. It should be noted that the sets of command types and time intervals depicted in FIG. 18A are stored in the storage unit 1024B, for example.

In FIG. 18A, commands of ON, OFF, ON, and OFF being issued in order from the top are depicted as a command set, and time intervals from the previous command being sent are depicted as time periods. Furthermore, the power change assumed when an ON command is issued is an increase in power consumption, and the power change assumed when an OFF command is issued is a decrease in power consumption.

FIG. 18B is a drawing depicting a power change pattern that is assumed when the command set depicted in FIG. 18A is issued. FIG. 18B depicts a power change pattern that is divided at each 30 seconds, in which an increase in power consumption is depicted as "+", a decrease in power consumption is depicted as "−", and no power consumption change is depicted as "0". It should be noted that the power change pattern depicted in FIG. 18B is an example of the specific pattern.

[Operation of Detection Unit]

Next, a description will be given regarding the operation of the detection unit 1022B when it is determined by the steady state determination unit 1021B that the state of the power amounts supplied by the plurality of branch circuits 21 is a steady state.

Figure 19:
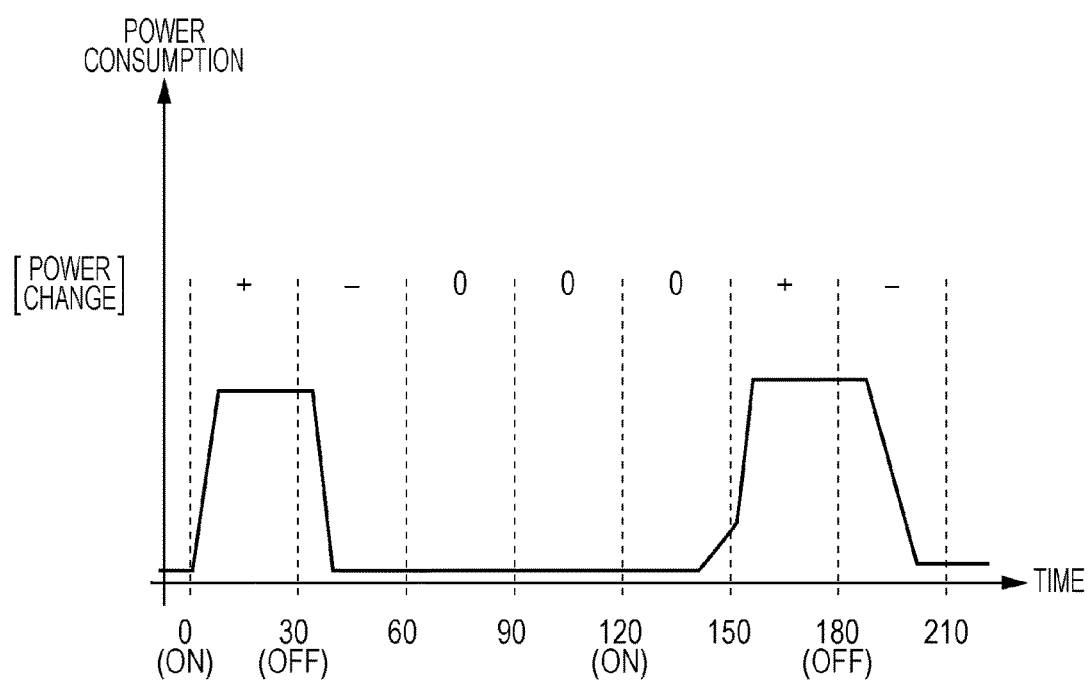
FIG. 19 is a drawing depicting an example of a power amount indicated by one item of power information acquired by an acquisition unit in Embodiment 3.

FIG. 19 is a drawing depicting an example of a power amount indicated by one item of power information acquired by the acquisition unit 101 in Embodiment 3. In FIG. 19, the horizontal axis (time) is divided at each 30 seconds, "+" is assigned to sections in which a power consumption value has increased by a predetermined value, "−" is assigned to sections in which the power consumption value has decreased by a predetermined numerical value, and "0" is assigned to sections in which power consumption has changed only by an amount equal to or less than a predetermined value.

First, it is assumed that it has been determined by the steady state determination unit 1021B that all of the branch circuits 21 are in a steady state, and the detection unit 1022B has therefore caused the command output unit 103 to output the command set in FIG. 18A to one electrical device 30. Furthermore, it is assumed that the power amounts indicated by one item of power information acquired by the acquisition unit 101 are those depicted in FIG. 19.

In this case, if power information that matches the specific pattern is included among the plurality of items of power information acquired by the acquisition unit 101, the detection unit 1022B detects this. In the present embodiment, when the pattern of "+", "−", and "0" in the sections at each 30 seconds depicted in FIG. 18B (the specific pattern) and the pattern of "+", "−", and "0" assigned to the sections at each 30 seconds depicted in FIG. 19 (power information) are similar, the detection unit 1022B is able to determine that the pattern (power information) depicted in FIG. 19 and the specific pattern depicted in FIG. 18B match.

It should be noted that the similarity between the pattern of FIG. 18B and the pattern of FIG. 19 is able to be determined on the basis of a concept referred to as edit distance. When the replacement, insertion, and deletion of the power change marks is repeated to change from the pattern of FIG. 18B (pattern 1) to the pattern of FIG. 19 (pattern 2), a predetermined numerical value is added whenever a mark is replaced, inserted, or deleted, and the minimum value for that calculated value can be used as the edit distance. For example, the cost for each of replacing, inserting, and deleting is assumed to be 1, and in order to convert from pattern 1 of "+−00+0−" to pattern 2 of "+−000+−", a "0" is inserted into the 5th position of pattern 1 and the "0" at the 7th position is then deleted to reach pattern 2. In other words, the edit distance of pattern 1 and pattern 2 is able to be determined as being 2. It can then be determined that pattern 1 and pattern 2 are similar when the determined edit distance is equal to or less than a predetermined value.

[Effects Etc. of Embodiment 3]

As described above, according to Embodiment 3, an information processing method, an information processing apparatus, and a recording medium having a program recorded thereon, with which it is possible to more reliably determine the connection relationship between a circuit that supplies power and an electrical device that is connected to that circuit, are able to be realized.

More specifically, according to Embodiment 3, when it is possible to distinguish a power amount change pattern (specific pattern) that is expected according to a plurality of command sets to be transmitted thereafter, it is possible for a steady state to be broadly applied such as determining that all of the circuits are in a steady state. Then, when it has been possible to determine a steady state, if the command set is output and the pattern of power amount changes measured by one branch circuit matches a specific pattern corresponding to the output command set, it is possible to specify that the one branch circuit is connected to the electrical device for which the command set was output.

In this way, according to Embodiment 3, it is possible to determine the connection relationship even when there is a fluctuation in the power amount measured by the branch circuit and that fluctuation is irregular.

It should be noted that, even in the case where there are no commands that cause power consumption to change according to the specific pattern in an electrical device for which the connection relationship is desired to be determined, power consumption may be changed according to the specific pattern in the electrical device by outputting a command that instructs a simple operation change, at prescribed time intervals and according to a prescribed pattern.

Embodiment 4

When many electrical devices are connected to one branch circuit, there are cases where power amount changes measured by the branch circuit are not very stable. However, when there is a fluctuation in the power amount measured by a branch circuit but there is no periodicity in that fluctuation, it is sometimes the case that, by periodically superimposing, increasing fluctuations and decreasing fluctuations at each time point are negated, the amount of change in superimposed power amounts decreases, and the changes stabilize. In the present embodiment, a description will be given regarding a method with which connection relationships are able to be determined in this situation.

[Configuration Etc. of Information Processing Apparatus]

The information processing apparatus in the present embodiment determines that the state of a power amount consumed by an electrical device is a steady state when, in a prescribed period, the power consumption of the electrical device exhibits no periodicity in a specific period. It should be noted that, in the information processing apparatus in the present embodiment, the configuration of a determination unit 102A is different with respect to the information processing apparatus 10 in Embodiment 1.

Figure 22:
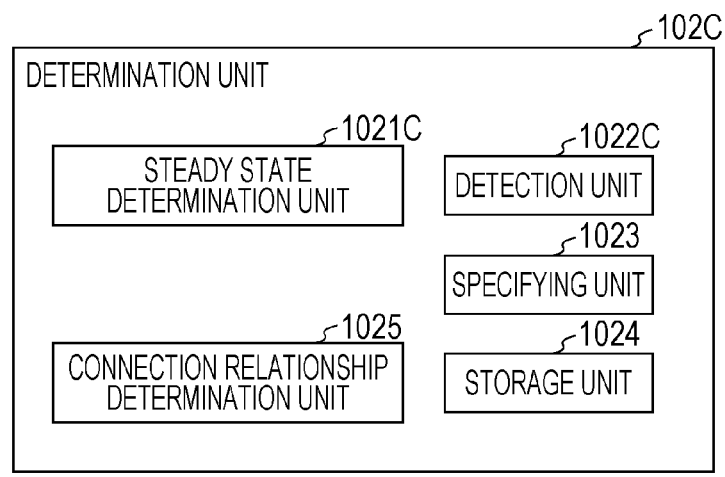
FIG. 22 is a block diagram depicting an example of the detailed configuration of a determination unit in Embodiment 4.

FIG. 22 is a block diagram depicting an example of the detailed configuration of a determination unit 102C in Embodiment 4. The same reference numbers have been appended to the same elements as in FIG. 8 and detailed descriptions thereof have been omitted. In the determination unit 102C depicted in FIG. 22, the operations of a steady state determination unit 1021C and a detection unit 1022C are different with respect to the determination unit 102 depicted in FIG. 8.

In the case where power data is superimposed in a specific period and a fluctuation in the superimposed power is equal to or less than a predetermined value, it has been determined that the state of the power amount supplied by the at least one branch circuit 21 is a steady state, and it has been determined that the power amount supplied in the prescribed period by a plurality of branch circuits 21 excluding the at least one branch circuit 21 from among the plurality of branch circuits 21 is a steady state, the steady state determination unit 1021C determines that the state of the power amounts supplied by all of the branch circuits is a steady state.

Figure 20A:
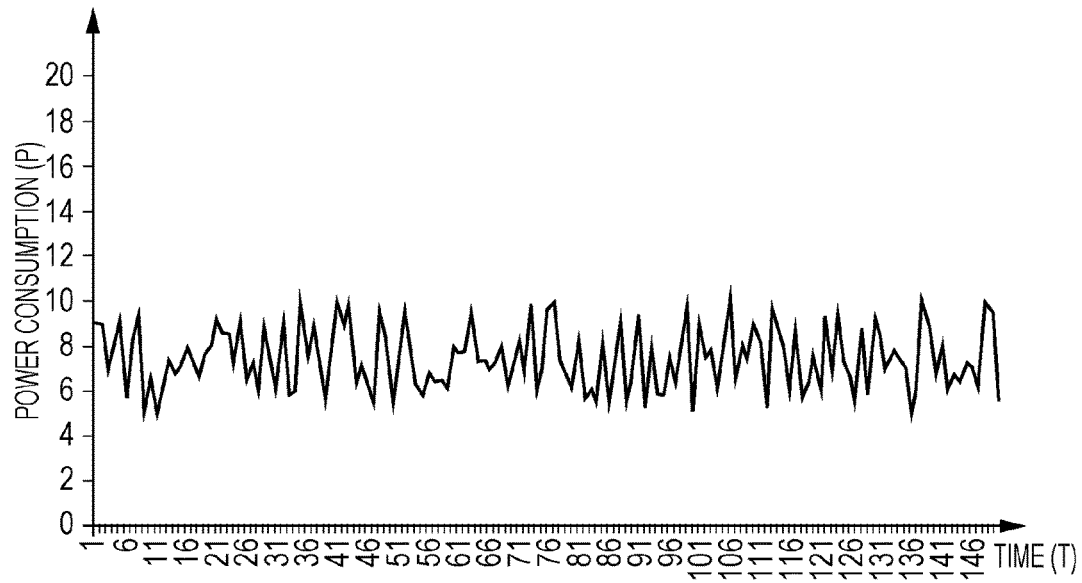
FIG. 20A is a drawing depicting an example of when it is determined that one branch circuit in Embodiment 4 is in a steady state.
Figure 20B:
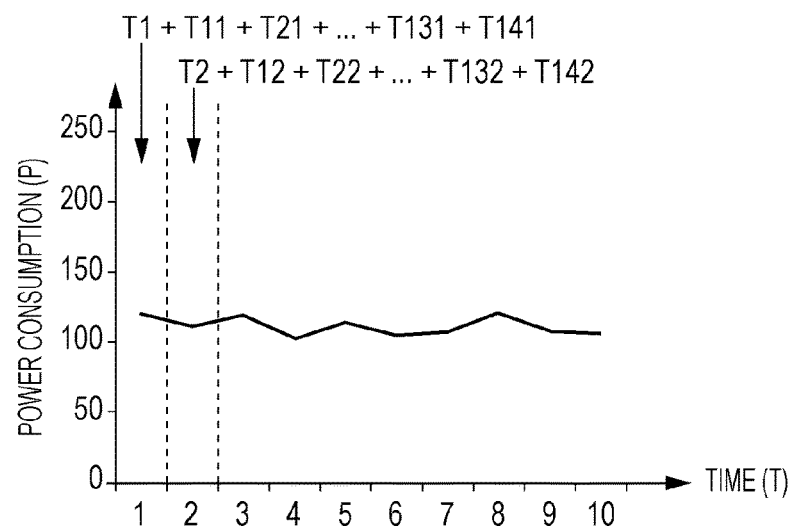
FIG. 20B is a drawing depicting an example of when it is determined that one branch circuit in Embodiment 4 is in a steady state.

FIGS. 20A and 20B are drawings depicting an example of when it is determined that one branch circuit 21 in Embodiment 4 is in a steady state. FIG. 20B depicts the superimposition, in a specific period 10, of fluctuations in the power amounts indicated by the power information of one branch circuit 21 depicted in FIG. 20A. When the fluctuations in the superimposed power depicted in FIG. 20B are equal to or less than a predetermined value, FIG. 20A depicts an example of when the one branch circuit 21 is in a steady state, in other words, when there is little fluctuation in the power amount in the prescribed period indicated by the power information of the one branch circuit 21.

Consequently, the information processing apparatus in the present embodiment may determine that all of the branch circuits 21 are in a steady state when, in each of the branch circuits 21, the change amount of the superimposed power is equal to or less than the predetermined value when superimposed in the specific period.

Furthermore, the information processing apparatus in the present embodiment may output a command set in which one electrical device is made to repeatedly turn ON and OFF in the specific period, as commands that cause a change in power consumption with respect to the one electrical device.

Figure 21A:
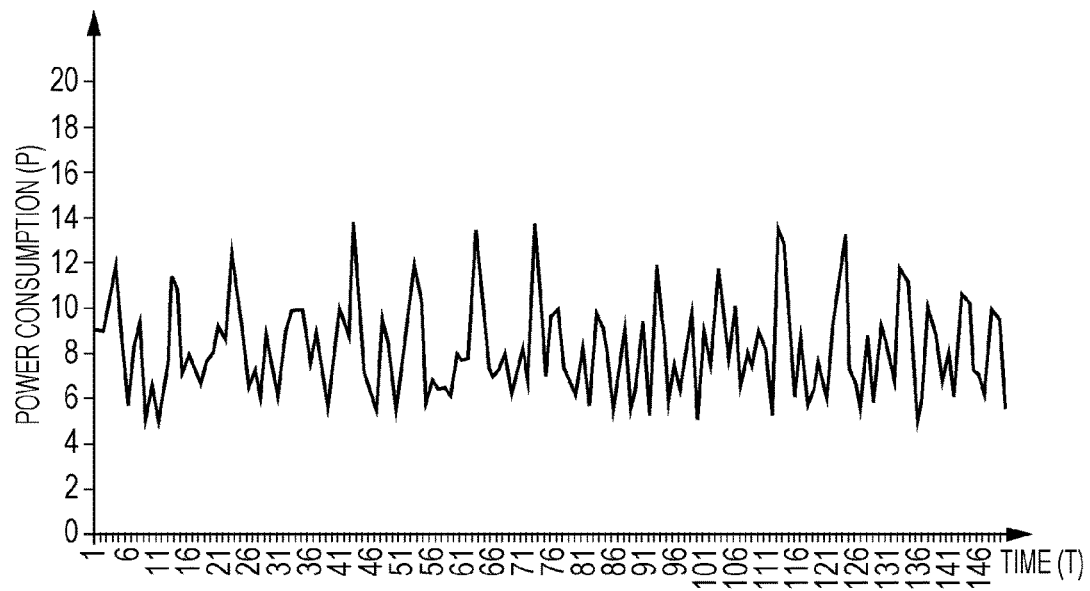
FIG. 21A is a drawing depicting an example of fluctuations in power consumption that occur when a command set in Embodiment 4 is issued to the one electrical device depicted in FIG. 20A.
Figure 21B:
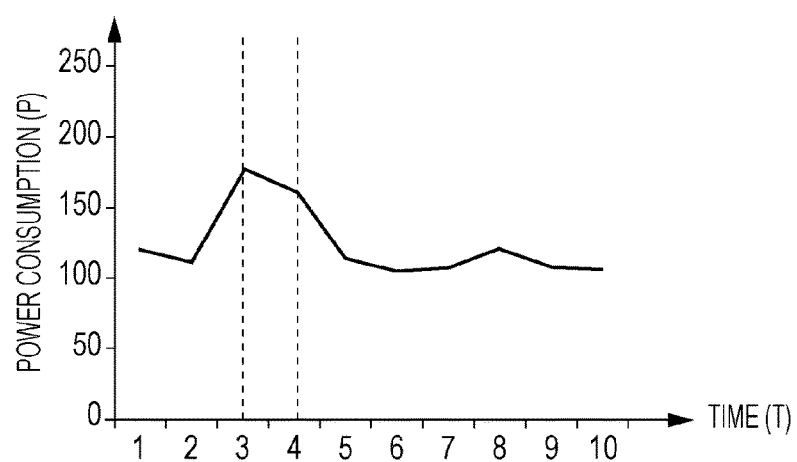
FIG. 21B is a drawing depicting an example of fluctuations in power consumption that occur when the command set in Embodiment 4 is issued to the one electrical device depicted in FIG. 20A.

FIG. 21A is a drawing depicting an example of fluctuations in power consumption that occur when a command set in Embodiment 4 is issued to the electrical device depicted in FIG. 20A. FIG. 21B depicts the superimposition of FIG. 21A in the specific period 10.

In the power consumption depicted in FIG. 21A, the fluctuations are irregular and large and a change in power consumption corresponding to the command set is not able to be detected in this state. That is, the fluctuations in the power amount of the one electrical device measured are indicated in FIG. 21A as a result of the one electrical device depicted in FIG. 20A carrying out ON and OFF power source state changes in a periodic manner in a specific period in accordance with the command set of the present embodiment. However, a change in power consumption corresponding to the command set is not able to be detected in this state.

Thus, by superimposing FIG. 21A in the specific period, it is possible to superimpose the timings of the ON and OFF power source state changes of the one electrical device, and therefore, as depicted in FIG. 21B, the changes in power consumption of the one electrical device are able to be amplified and the fluctuations in power consumption are able to be negated. It thereby becomes easy to specify a branch circuit 21 in which a change in power consumption has occurred in accordance with the issuing of a command set. The superimposing is implemented in a specific period in the example depicted in FIG. 21B; however, it should be noted that a change in power consumption of a specific period may be determined by decomposing into frequency components using the Fourier transform or the like.

[Effects Etc. of Embodiment 4]

As described above, according to Embodiment 4, an information processing method, an information processing apparatus, and a recording medium having a program recorded thereon, with which it is possible to more reliably determine the connection relationship between a circuit that supplies power and an electrical device that is connected to that circuit, are able to be realized.

More specifically, according to the information processing method and the like of the present embodiment, by outputting a command set to one electrical device, a change in the operating state of the one electrical device is made to repeat in a fixed period (specific period). The timings at which a state change that turns the power source from OFF to ON and a state change that turns the power source from ON to OFF have been carried out are then superimposed by causing a history of power changes measured by the branch circuit to be superimposed in the specific period.

In more detail, it is expected for the power consumption of the branch circuit to which the one electrical device is connected to increase immediately after the power source state of the one electrical device has been changed from OFF to ON, and for the power consumption of the branch circuit to which the one electrical device is connected to decrease immediately after the power source state of the one electrical device has been changed from ON to OFF. However, the fluctuations in the power consumption of the branch circuit to which the one electrical device is connected are irregular and large and a change in power consumption corresponding to the command set is not able to be detected in this state. Therefore, in the present embodiment, the history of power changes measured by the branch circuit is superimposed in the specific period, and changes in power consumption that are measured according to the changes in power consumption of the one electrical device corresponding to the issuing of the command set are thereby able to be amplified and fluctuations in that power consumption are able to be negated. In other words, it becomes easy to specify a branch circuit in which a change in power consumption has occurred in accordance with the issuing of the command set.

In this way, it is possible to more reliably determine the connection relationship between a circuit that supplies power and an electrical device that is connected to that circuit.

As described above, according to the present disclosure, it is possible to realize an information processing method and the like with which it is possible to more reliably determine the connection relationship between a circuit that supplies power and an electrical device that is connected to that circuit.

Specifically, according to the information processing method of the present disclosure, a steady state in which it is easy for power changes to be observed (measured) is determined when the supplied power (power consumption) measured in each branch circuit is fixed, or when the supplied power (power consumption) measured in each branch circuit and superimposed in a specific period is fixed.

Furthermore, according to the information processing method of the present disclosure, a command that causes a change in power consumption with respect to one electrical device may be a single command, a command set with which a single command is issued a plurality of times, and a command set that causes a prescribed power consumption change pattern.

Furthermore, as an operation that causes a change in power consumption that corresponds to the command, it is permissible to turn the power source of one electrical device from OFF to ON or from ON to OFF, and it is permissible to turn the power source of the one electrical device from OFF to ON and then additionally to OFF. Furthermore, it is permissible to repeatedly turn the power source of the one electrical device ON/OFF in a specific period, and it is permissible to cause the power state to change according to a specific pattern.

Moreover, a situation where the accuracy of determining the connection relationship between a branch circuit and an electrical device connected to the branch circuit is low is also feasible. For example, when close to the numerical values used for the determination basis in the unsteadiness detection processing, it may be determined that the accuracy of detecting power information that includes a change in power consumption corresponding to the command is low, and the connection relationship may be determined once again when steady state determination is carried out after a fixed time period.

Furthermore, a situation where the connection relationship has been determined once but then the electrical device is connected to a branch circuit that is different from the original branch circuit due to the user remodeling a room and so forth is also feasible.

(1) It may be detected that the electrical device is connected to a branch circuit that is different from the original branch circuit when the user carries out an operation via a home server such as AiSEG (registered trademark) and turns the power source of an electrical device to ON. In this case, the home server determines whether all of the branch circuits are in a steady state before an ON control signal is issued to the electrical device in accordance with the operation performed by the user. (2) Regardless of it having been determined that all of the branch circuits are in a steady state, and even though an ON control signal is sent to the electrical device, according to the determined connection relationship, it is detected that the power consumption of the branch circuit to which the electrical device should be connected does not change. In the information processing method and the like of the present disclosure, when (1) and (2) have occurred a fixed number of times or more in a fixed period, it may be presumed that the connection relationship has changed and collapsed, and the connection relationship may be determined once again.

It should be noted that, in the aforementioned embodiments, the constituent elements may be configured using dedicated hardware or may be realized by executing a software program suitable for the constituent elements. Each constituent element may be realized by a program execution unit such as a CPU or a processor reading out and executing a software program recorded in a recording medium such as a hard disk or a semiconductor memory.

Other Modified Examples

Hereinabove, methods for resolving the connection relationship between a branch circuit and an electrical device according to one or more aspects of the present disclosure have been described; however, the present disclosure is not restricted to these embodiments. Modes in which various modifications conceived by a person skilled in the art have been implemented in the present embodiments, and modes constructed by combining the constituent elements in different embodiments may also be included within the scope of one or more aspects of the present disclosure provided they do not depart from the gist of the present disclosure. For example, cases such as the following are also included in the present disclosure.

(1) Specifically, the aforementioned devices are constituted by a computer system configured from a microprocessor, a ROM, a RAM, a hard disk unit, a display unit, a keyboard, a mouse, and the like. A computer program is stored in the RAM or the hard disk unit. The devices achieve the functions thereof as a result of the microprocessor operating according to the computer program. Here, in order to achieve prescribed functions, the computer program is configured with a plurality of command codes that indicate instructions for the computer being combined.

(2) Some or all of the constituent elements that make up the aforementioned devices may be configured from one system large-scale integration (LSI). A system LSI is a multifunctional LSI in which a plurality of components are integrated and manufactured on one chip and, specifically, is a computer system configured including a microprocessor, a ROM, a RAM, and the like. A computer program is stored in the RAM. The system LSI achieves the functions thereof as a result of the microprocessor operating according to the computer program.

(3) Some or all of the constituent elements that make up the aforementioned devices may be configured from an IC card or an individual module that is able to be attached to and detached from the devices. The IC card or the module is a computer system configured from a microprocessor, a ROM, a RAM, and the like. The IC card or the module may include the aforementioned multifunctional LSI. The IC card or the module achieves the functions thereof as a result of the microprocessor operating according to a computer program. This IC card or this module may be tamper-resistant.

(4) The present disclosure may be a method given above. Furthermore, a computer program that realizes these methods by means of a computer is permissible, and a digital signal that includes a computer program is permissible.

Furthermore, in the present disclosure, the computer program or the digital signal may be recorded on a computer-readable recording medium such as a flexible disk, a hard disk, a CD-ROM, an MO, a DVD, a DVD-ROM, a DVD-RAM, a BD (Blu-ray (registered trademark) disc), a semiconductor memory, or the like. Furthermore, the digital signal may be recorded on these recording mediums.

Furthermore, the present disclosure may be realized by the computer program or the digital signal being transmitted via an electric telecommunication line, a wireless or wired telecommunication line, a network represented by the Internet, a data broadcast, or the like.

Furthermore, the present disclosure may be a computer system provided with a microprocessor and a memory, in which the memory stores the computer program and the microprocessor operates according to the computer program.

Furthermore, the present disclosure may be carried out by the program or the digital signal being recorded on the recording medium and being transferred, by the program or the digital signal being transferred via the network or the like, or by another independent computer system.

(5) The aforementioned embodiments and the modified examples may be combined.

The present disclosure can be used for an information processing method, an information processing apparatus, and a recording medium having a program recorded thereon, and, in particular, can be applied in an information processing method, an information processing apparatus, and a recording medium having a program recorded thereon constituted by a server, a cloud server, or a home server.

What is claimed is:

1. A method, executed by a processor including a memory, for determining which electrical circuit from a plurality of circuits one or more electrical devices are connected, the method comprising:
   acquiring power information, by the processor, indicating a power amount supplied by each of the plurality of circuits to which the one or more electrical devices are respectively connected, which indicates a steady state of each of the plurality of circuits;
   outputting a command, by the processor, that causes a change in power consumption with respect to one of the electrical devices; and
   determining, by the processor, a connection relationship between the one electrical device and the circuit to which the one electrical device is connected, based on a change in the power information acquired in the acquiring,
   wherein, in the determining, it is determined whether or not a state of the power amounts supplied by each of the plurality of circuits is in the steady state from the plurality of items of power information acquired in the acquiring,
   wherein when it is determined that the state of the power amounts supplied by the plurality of circuits is in the steady state, the connection relationship is determined by causing the command for the one electrical device to be output in the outputting of the command and specifying that the circuit corresponding to the power information that includes the change in power consumption corresponding to the command that was output in the outputting of the command, from among the power information acquired in the acquiring, is the circuit to which the one electrical device is connected,
   wherein, in the determining, it is determined that the state of the power amounts supplied by the plurality of circuits is the steady state (i) when a fluctuation in the power amounts supplied in a prescribed period by at least one circuit from among the plurality of circuits indicates a prescribed pattern, and (ii) when the power amounts supplied in the prescribed period by a plurality of circuits, excluding the at least one circuit, are in the steady state,
   wherein, in the determining,
      when the power information that includes a time difference change amount for the power amount that is equal to or greater than a first predetermined value is detected from among the power information of the plurality of circuits, excluding the at least one circuit from among the plurality of circuits, the time difference change amount being a summed value of the power amount in a predetermined period within a prescribed time period from a time at which the command was issued in the outputting of the command, it is specified that the circuit corresponding to the detected power information is the circuit to which the one electrical device is connected, and
      when the power information that includes the time difference change amount for the power amount that is equal to or greater than a second predetermined value for the prescribed pattern is detected, from among the power information of the at least one circuit from within the prescribed time period, it is specified that the circuit corresponding to the detected power information is the circuit to which the one electrical device is connected, and
   wherein the determining determines the power amounts supplied in the prescribed period by the plurality of circuits, excluding the at least one circuit, are in the unsteady state when all of the time difference change amounts for the power amounts that are less than the predetermined value are detected from among the power information of the plurality of circuits, excluding the at least one circuit from among the plurality of circuits.

2. The method according to claim 1, wherein the determining further comprises:
   specifying that the circuit corresponding to the power information detected in the detecting is the circuit to which the one electrical device is connected;
   storing an association between the circuit specified in the specifying and the one electrical device; and
   determining the connection relationship, based on the association stored in the storing.

3. The method according to claim 1,
   wherein, in the determining, when a fluctuation in the power amounts supplied by each of the plurality of circuits in a prescribed period is equal to or less than a predetermined value, it is determined that the state of the power amounts supplied by the plurality of circuits is the steady state,
   and it is specified that the circuit corresponding to the power information that includes a time difference change amount for the power amount that is equal to or greater than a predetermined value, the time difference change amount being a summed value of the one of the power amount in a predetermined period within a prescribed time period from a time at which the command was issued in the outputting of the command, is the circuit to which the one electrical device is connected.

4. The method according to claim 1,
   wherein, in the outputting of the command, a command that causes a power source state of the one electrical device to change from OFF to ON is output as the command that causes the change in power consumption with respect to the one electrical device.

5. The method according to claim 1,
   wherein, in the outputting of the command, a command that causes a power source state of the one electrical device to change from ON to OFF is output as the command that causes the change in power consumption with respect to the one electrical device.

6. The method according to claim 1,
   wherein, in the determining, when a fluctuation in a prescribed period in the power amount supplied by each of the plurality of circuits does not match a specific pattern, it is determined that the state of the power amounts supplied by the plurality of circuits is the steady state, and a command that causes the power consumption of the one electrical device to change according to the specific pattern is output in the outputting of the command, and it is specified that the circuit corresponding to the power information that matches the specific pattern within a prescribed time period from a time at which the command was issued in the outputting of the command, as the power information that includes the change in power consumption corresponding to the command, is the circuit to which the one electrical device is connected.

7. The method according to claim 6, wherein the specific pattern is a pattern in which the same change in the power amounts is repeated a plurality of times in a fixed period.

8. The method according to claim 7, wherein, in the determining, when a time difference change amount, which is a summed value of the power amount supplied in the fixed period in each of the plurality of circuits is equal to or less than a predetermined value, it is determined that the fluctuation in the prescribed interval in the power amounts supplied by the plurality of circuits does not match the specific pattern.

9. The method according to claim 1, wherein, in the outputting of the command, a command set that causes the change in power consumption with respect to the one electrical device is made up of a plurality of sets of types and time intervals, and is output as the command that causes the change in power consumption with respect to the one electrical device.

10. The method according to claim 1, wherein, in the determining, by referring to a database in which information that identifies the electrical devices, operations with respect to the electrical devices, and power consumption change patterns that accompany the operations is associated, it is detected that the change in power consumption corresponding to the command that was output in the outputting of the command is included within the plurality of items of power information acquired in the acquiring.

11. The method according to claim 1, further comprising:

outputting a notification for causing the user to execute the command that causes the change in power consumption with respect to the one electrical device, wherein, in the determining, the connection relationship is determined by outputting the notification for causing the user to execute the command for the one electrical device in the outputting of the notification and specifying that the circuit corresponding to the power information that includes the change in power consumption corresponding to the command that corresponds to the notification that was output in the outputting of the notification, from among the plurality of items of power information acquired in the acquiring, is the circuit to which the one electrical device is connected.

12. An apparatus for determining which electrical circuit, from a plurality of circuits, one or more electrical devices are connected, the apparatus comprising:

a processor; and a non-transitory recording medium having recorded thereon a program that, when executed by the processor, causes the processor to perform operations, including acquiring power information indicating a power amount supplied by each of a plurality of circuits to which one or more electrical devices are respectively connected, which indicates a steady state of each of the plurality of circuits;

outputting a command that causes a change in power consumption with respect to one of the electrical devices; and determining a connection relationship between the one electrical device and the circuit to which the one electrical device is connected, based on a change in the power information acquired in the acquiring, wherein, in the determining, it is determined whether or not a state of the power amounts supplied by each of the plurality of circuits is in the steady state from the plurality of items of power information acquired, wherein when it is determined that the state of the power amounts supplied by the plurality of circuits is in the steady state, the connection relationship is determined by outputting the command for the one electrical device and specifying that the circuit corresponding to the power information that includes the change in power consumption corresponding to the command, from among the power information acquired, is the circuit to which the one electrical device is connected, and wherein, in the determining, it is determined that the state of the power amounts supplied by the plurality of circuits is the steady state (i) when a fluctuation in the power amounts supplied in a prescribed period by at least one circuit from among the plurality of circuits indicates a prescribed pattern, and (ii) when the power amounts supplied in the prescribed period by a plurality of circuits, excluding the at least one circuit, are in the steady state, wherein, in the determining, when the power information that includes a time difference change amount for the power amount that is equal to or greater than a first predetermined value is detected from among the power information of the plurality of circuits, excluding the at least one circuit from among the plurality of circuits, the time difference change amount being a summed value of the power amount in a predetermined period within a prescribed time period from a time at which the command was issued in the outputting of the command, it is specified that the circuit corresponding to the detected power information is the circuit to which the one electrical device is connected, and when the power information that includes the time difference change amount for the power amount that is equal to or greater than a second predetermined value for the prescribed pattern is detected, from among the power information of the at least one circuit from within the prescribed time period, it is specified that the circuit corresponding to the detected power information is the circuit to which the one electrical device is connected, and wherein the determining determines the power amounts supplied in the prescribed period by the plurality of circuits, excluding the at least one circuit, are in the unsteady state when all of the time difference change amounts for the power amounts that are less than the predetermined value are detected from among the power information of the plurality of circuits, excluding the at least one circuit from among the plurality of circuits.

* * * * *